US007450037B2

(12) United States Patent
Yajima et al.

(10) Patent No.: US 7,450,037 B2

(45) **Date of Patent: *Nov. 11, 2008**

(54) INTEGRATED CIRCUIT DEVICE AND ELECTRONIC INSTRUMENT THAT TRANSFERS DATA THROUGH A SERIAL BUS

(75) Inventors: Hidehiko Yajima, Suwa (JP); Takemi Yonezawa, Fujimi-cho (JP); Fumikazu Komatsu, Okaya (JP); Mitsuaki Sawada, Suwa (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 11/508,872

(22) Filed: Aug. 24, 2006

(65) Prior Publication Data

US 2007/0057826 A1 Mar. 15, 2007

(30) Foreign Application Priority Data

Aug. 31, 2005 (JP) ............................ 2005-251631

(51) Int. Cl.
*H03M 9/00* (2006.01)

(52) U.S. Cl. ...................................... 341/100; 341/155

(58) Field of Classification Search .......... 341/100–155
See application file for complete search history.

(56) References Cited

U.S. PATENT DOCUMENTS

| | | | | |
|---|---|---|---|---|
| 6,707,314 | B2 | 3/2004 | Kasahara et al. | |
| 6,760,772 | B2 * | 7/2004 | Zou et al. | 709/230 |
| 7,079,555 | B2 * | 7/2006 | Baydar et al. | 370/532 |
| 2002/0011998 | A1 | 1/2002 | Tamura | |
| 2005/0134309 | A1 | 6/2005 | Komatsu et al. | |

FOREIGN PATENT DOCUMENTS

| | | |
|---|---|---|
| JP | A 2001-222249 | 8/2001 |
| JP | A 2002-343864 | 11/2002 |
| JP | A 2005-183513 | 7/2005 |

OTHER PUBLICATIONS

U.S. Appl. No. 11/270,553; Kumagai et al.; filed Nov. 10, 2005.

* cited by examiner

*Primary Examiner*—Lam T Mai
(74) *Attorney, Agent, or Firm*—Oliff & Berridge, PLC

(57) ABSTRACT

An integrated circuit device includes a high-speed I/F circuit block which transfers data through a serial bus, and a driver logic circuit block which generates a display control signal. The high-speed I/F circuit block includes a physical layer circuit including a receiver circuit, and a high-speed I/F logic circuit including a serial/parallel conversion circuit. The high-speed I/F circuit block is disposed so that the high-speed I/F logic circuit is disposed between the physical layer circuit and the driver logic circuit block and the physical layer circuit and the driver logic circuit block are not adjacently disposed.

20 Claims, 19 Drawing Sheets

FIG. 12

| | WITH MEMORY (RAM) | | WITHOUT MEMORY | | CSTN | TFD |
|---|---|---|---|---|---|---|
| | AMORPHOUS TFT | LOW-TEMPERATURE POLYSILICON TFT | AMORPHOUS TFT | LOW-TEMPERATURE POLYSILICON TFT | | |
| MEMORY (RAM) | INCLUDE | INCLUDE | NOT INCLUDE | NOT INCLUDE | INCLUDE | INCLUDE |
| DATA DRIVER | INCLUDE | INCLUDE | INCLUDE | INCLUDE | INCLUDE | INCLUDE |
| SCAN DRIVER | INCLUDE | NOT INCLUDE | INCLUDE | NOT INCLUDE | INCLUDE | INCLUDE |
| LOGIC CIRCUIT (G/A) | INCLUDE | INCLUDE | INCLUDE | INCLUDE | INCLUDE | INCLUDE |
| GRAYSCALE VOLTAGE GENERATION CIRCUIT ($\gamma$) | INCLUDE | INCLUDE | INCLUDE | INCLUDE | NOT INCLUDE | NOT INCLUDE |
| POWER SUPPLY CIRCUIT | INCLUDE | INCLUDE | INCLUDE | INCLUDE | INCLUDE | INCLUDE |

INTEGRATED CIRCUIT DEVICE AND ELECTRONIC INSTRUMENT THAT TRANSFERS DATA THROUGH A SERIAL BUS

Japanese Patent Application No. 2005-251631 filed on Aug. 31, 2005, is hereby incorporated by reference in its entirety.

BACKGROUND OF THE INVENTION

The present invention relates to an integrated circuit device and an electronic instrument.

In recent years, a high-speed serial transfer such as low voltage differential signaling (LVDS) has attracted attention as an interface aiming at reducing EMI noise or the like. In such a high-speed serial transfer, data is transferred by causing a transmitter circuit to transmit serialized data using differential signals and causing a receiver circuit to differentially amplify the differential signals (JP-A-2001-222249).

An ordinary portable telephone includes a first instrument section provided with buttons for inputting a telephone number or characters, a second instrument section provided with a liquid crystal display (LCD) or a camera device, and a connection section (e.g. hinge) which connects the first and second instrument sections. Therefore, the number of interconnects passing through the connection section can be reduced by transferring data between a first circuit board provided in the first instrument section and a second circuit board provided in the second instrument section by high-speed serial transfer using small-amplitude differential signals.

A display driver (LCD driver) is known as an integrated circuit device which drives a display panel such as a liquid crystal panel. In order to realize a high-speed serial transfer between the first and second instrument sections, a high-speed interface circuit which transfers data through a serial bus must be incorporated in the display driver.

On the other hand, since the differential signals of the high-speed interface circuit have a small voltage amplitude of 0.1 to 1.0 V, the high-speed interface circuit tends to be affected by noise which occurs in the driver circuit. Moreover, the driver circuit may be affected by noise which occurs in the high-speed interface circuit.

SUMMARY

The invention relates to an integrated circuit device comprising:

a high-speed interface circuit block which transfers data through a serial bus; and a driver logic circuit block which generates a display control signal;

the high-speed interface circuit block including:

a physical layer circuit including a receiver circuit which receives serial data through the serial bus; and a high-speed interface logic circuit including a serial/parallel conversion circuit which converts serial data received through the serial bus into parallel data; and the high-speed interface circuit block being disposed so that the high-speed interface logic circuit is disposed between the physical layer circuit and the driver logic circuit block and the physical layer circuit and the driver logic circuit block are not adjacently disposed.

The invention also relates to an electronic instrument comprising:

the above integrated circuit device; and a display panel driven by the integrated circuit device.

BRIEF DESCRIPTION OF THE SEVERAL VIEWS OF THE DRAWING

FIGS. 9A and 9B illustrate detailed arrangement examples of an integrated circuit device and the like.

FIGS. 10A and 10B illustrate detailed arrangement examples of an integrated circuit device and the like.

FIG. 12 illustrates an example of various types of display drivers and circuit blocks provided in the display drivers.

DETAILED DESCRIPTION OF THE EMBODIMENT

Figure 1:
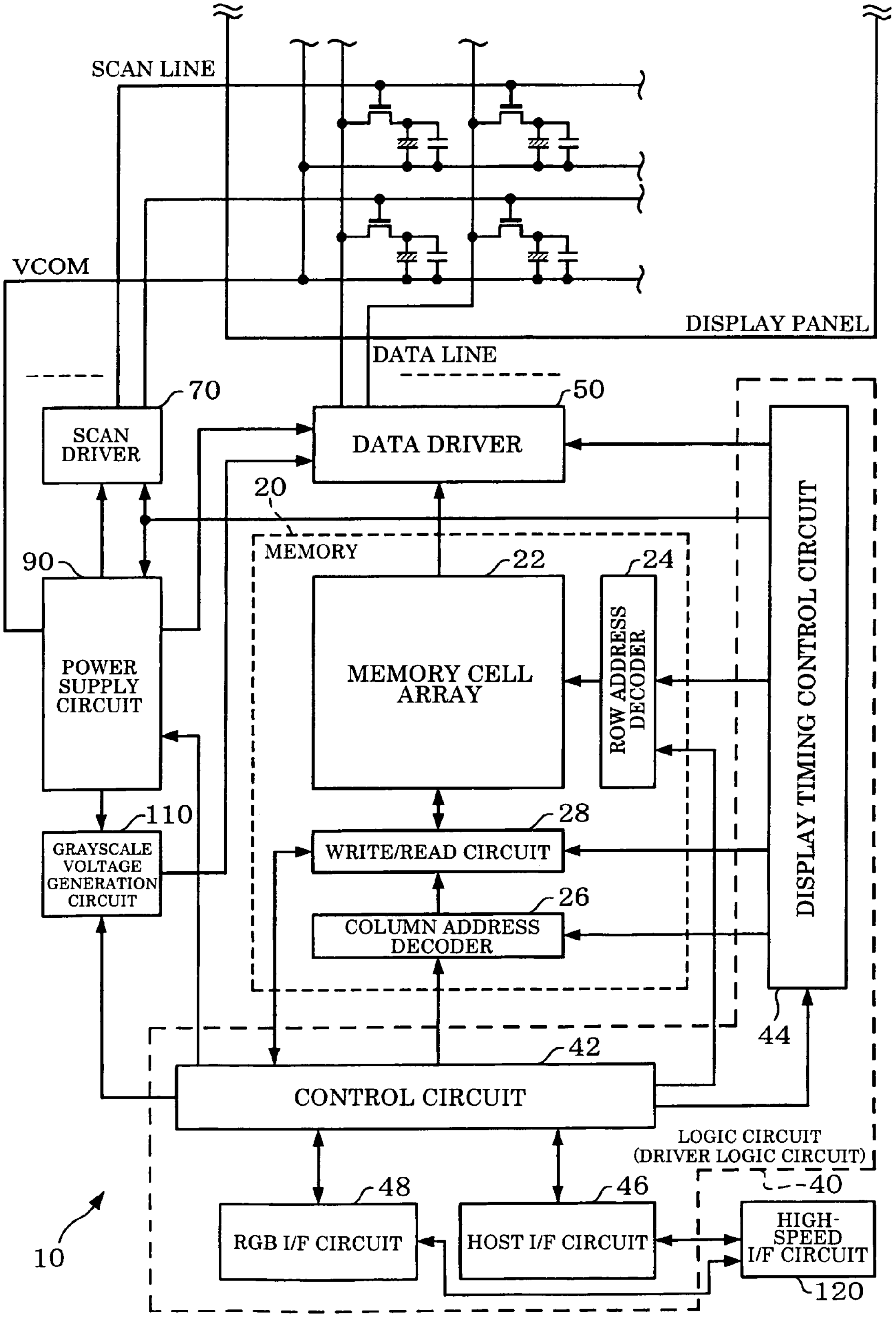
FIG. 1 illustrates a circuit configuration example of an integrated circuit device.

The invention may provide an integrated circuit device which can reduce adverse effects of noise and the like, and an electronic instrument including the integrated circuit device.

One embodiment of the invention relates to an integrated circuit device comprising:

a high-speed interface circuit block which transfers data through a serial bus; and a driver logic circuit block which generates a display control signal;

the high-speed interface circuit block including:

a physical layer circuit including a receiver circuit which receives serial data through the serial bus; and a high-speed interface logic circuit including a serial/parallel conversion circuit which converts serial data received through the serial bus into parallel data; and the high-speed interface circuit block being disposed so that the high-speed interface logic circuit is disposed between the physical layer circuit and the driver logic circuit block and the physical layer circuit and the driver logic circuit block are not adjacently disposed.

According to this embodiment, since the high-speed interface logic circuit is interposed between the physical layer circuit and the driver logic circuit block, the distance between the physical layer circuit and the driver logic circuit block can be increased. Therefore, adverse effects of noise generated by the driver logic circuit block or the physical layer circuit can be reduced, whereby the transmission quality and the like can be improved.

In the integrated circuit device according to this embodiment, when a direction from a first side which is a short side of the integrated circuit device toward a third side opposite to the first side is a first direction and a direction from a second side which is a long side of the integrated circuit device toward a fourth side opposite to the second side is a second direction, the high-speed interface logic circuit may be disposed on the second direction side of the physical layer circuit, and the driver logic circuit block may be disposed on the second direction side of the high-speed interface logic circuit.

This allows the physical layer circuit, the high-speed interface logic circuit, and the driver logic circuit block to be disposed along the second direction. Therefore, signal lines between these circuits and circuit blocks can be provided along a short path, whereby an efficient signal transmission can be achieved.

In the integrated circuit device according to this embodiment, when a direction from a first side which is a short side of the integrated circuit device toward a third side opposite to the first side is a first direction and a direction from a second side which is a long side of the integrated circuit device toward a fourth side opposite to the second side is a second direction, the high-speed interface logic circuit may be disposed on the second direction side of the physical layer circuit, and the driver logic circuit block may be disposed on the first direction side of the high-speed interface logic circuit.

According to this configuration, the high-speed interface logic circuit is interposed between the physical layer circuit and the driver logic circuit block so that the physical layer circuit and the driver logic circuit block are not adjacently disposed.

In the integrated circuit device according to this embodiment, a circuit block other than the high-speed interface circuit block may be disposed between the first side of the integrated circuit device and the high-speed interface circuit block, and a circuit block other than the high-speed interface circuit block may be disposed between the third side of the integrated circuit device opposite to the first side and the high-speed interface circuit block.

This allows the high-speed interface circuit block to be disposed in the region of the integrated circuit device excluding the ends. Therefore, an impedance mismatch due to the contact resistance of an external connection terminal (e.g. bump) can be reduced, whereby the high-speed serial transfer signal quality can be maintained.

In the integrated circuit device according to this embodiment, the high-speed interface circuit block may be formed as a macroblock including a pad region; and the high-speed interface circuit block may be disposed so that the second side of the integrated circuit device coincides with a second side of the high-speed interface circuit block.

This allows the high-speed interface circuit block to be easily disposed so that the driver logic circuit block and the physical layer circuit are not adjacently disposed.

In the integrated circuit device according to this embodiment, a power supply line for supplying power to a circuit block other than the high-speed interface circuit block may be provided along three sides of a rectangular region of the high-speed interface circuit block so that the power supply line avoids the rectangular region.

According to this configuration, not only the high-speed interface logic circuit, but also the wiring region of the power supply line is interposed between the physical layer circuit and the driver logic circuit block, whereby transmission of noise between the physical layer circuit and the driver logic circuit block can be further reduced.

The integrated circuit device according to this embodiment may comprise:

a grayscale voltage generation circuit block which generates grayscale voltages;

wherein the driver logic circuit block and the grayscale voltage generation circuit block may be adjacently disposed.

This allows a signal line between the driver logic circuit block and the grayscale voltage generation circuit block to be provided along a short path, whereby the layout efficiency can be improved.

The integrated circuit device according to this embodiment may comprise:

at least one data driver block which drives data lines;

wherein the grayscale voltage generation circuit block and the data driver block may be adjacently disposed.

This allows a signal line between the grayscale voltage generation circuit block and the data driver block to be provided along a short path, whereby the layout efficiency can be improved.

In the integrated circuit device according to this embodiment, the physical layer circuit may be disposed so that a first region is formed between a first side of the high-speed interface circuit block and the physical layer circuit and a second region is formed between a third side of the high-speed interface circuit block opposite to the first side and the physical layer circuit.

This increases the distance between the physical layer circuit and the driver logic circuit block, whereby adverse effects of noise can be reduced.

In the integrated circuit device according to this embodiment, the first and second regions may be first and second capacitor regions.

The integrated circuit device according to this embodiment may comprise:

first to Nth circuit blocks (N is an integer of two or more) disposed along a first direction when a direction from a first side which is a short side of the integrated circuit device toward a third side opposite to the first side is a first direction and a direction from a second side which is a long side of the integrated circuit device toward a fourth side opposite to the second side is a second direction;

wherein the first to Nth circuit blocks may include the high-speed interface circuit block and a circuit block other than the high-speed interface circuit block; and wherein the high-speed interface circuit block may be disposed as an Mth ($2 \leqq M \leqq N-1$) circuit block of the first to Nth circuit blocks.

According to this embodiment, the high-speed interface circuit block is disposed as the Mth circuit block of the first to Nth circuit blocks excluding the circuit blocks on the ends. Therefore, an impedance mismatch due to the contact resistance of an external connection terminal (e.g. bump) can be reduced, whereby the high-speed serial transfer signal quality can be maintained.

In the integrated circuit device according to this embodiment, the value M may be $[N/2]-2 \leqq M \leqq [N/2]+3$ ([X] is maximum integer which does not exceed X).

This allows the high-speed interface circuit block to be disposed near the center of the integrated circuit device, whereby an impedance mismatch due to the contact resistance of the external connection terminal can be further reduced.

In the integrated circuit device according to this embodiment, the Mth circuit block may include the high-speed interface circuit block and the driver logic circuit block; and the high-speed interface circuit block and the driver logic circuit block may be disposed along the second direction.

This allows a signal line between the high-speed interface circuit block and the driver logic circuit block to be provided along a short path, whereby the layout efficiency can be improved.

In the integrated circuit device according to this embodiment, the high-speed interface circuit block and the driver logic circuit block may be disposed along the first direction.

This allows the height of the high-speed interface circuit block in the second direction to be sufficiently secured, whereby the layout can be facilitated.

In the integrated circuit device according to this embodiment, the first to Nth circuit blocks may include:

a grayscale voltage generation circuit block which generates grayscale voltages; and at least one data driver block which receives the grayscale voltages from the grayscale voltage generation circuit block and drives data lines; and the grayscale voltage select circuit may be disposed between the driver logic circuit block and the data driver block.

This allows a signal line between the driver logic circuit block and the grayscale voltage generation circuit block and a signal line between the grayscale voltage generation circuit block and the data driver block to be provided along a short path, whereby the layout efficiency can be improved.

Another embodiment of the invention relates to an electronic instrument comprising:

the above integrated circuit device; and a display panel driven by the integrated circuit device.

Preferred embodiments of the invention are described below in detail. Note that the embodiments described hereunder do not in any way limit the scope of the invention defined by the claims laid out herein. Note that all elements of the embodiments described below should not necessarily be taken as essential requirements for the invention.

1. Circuit Configuration

FIG. 1 shows a circuit configuration example of an integrated circuit device 10 according to this embodiment. The circuit configuration of the integrated circuit device 10 is not limited to that shown in FIG. 1. Various modifications and variations may be made. For example, some of the elements shown in FIG. 1 may be omitted, or an element other than the elements shown in FIG. 1 may be additionally provided.

A memory 20 (display data RAM) stores image data. A memory cell array 22 includes a plurality of memory cells and stores image data (display data) of at least one frame (one screen). A row address decoder 24 (MPU/LCD row address decoder) decodes a row address and selects a wordline of the memory cell array 22. A column address decoder 26 (MPU column address decoder) decodes a column address and selects a bitline of the memory cell array 22. A write/read circuit 28 (MPU write/read circuit) writes image data into the memory cell array 22 or reads image data from the memory cell array 22.

A logic circuit 40 (driver logic circuit) generates a control signal for controlling the display timing, a control signal for controlling the data processing timing, and the like. The logic circuit 40 may be formed by automatic placement and routing such as a gate array (G/A). A control circuit 42 generates various control signals and controls the entire device. In more detail, the control circuit 42 outputs grayscale characteristic (gamma characteristic) adjustment data (gamma correction data) to a grayscale voltage generation circuit 110, and controls voltage generation of a power supply circuit 90. The control circuit 42 also controls memory writing/reading using the row address decoder 24, the column address decoder 26, and the write/read circuit 28. A display timing control circuit 44 generates various control signals for controlling the display timing, and controls reading of image data from the memory into the display panel. A host I/F circuit 46 (MPU I/F circuit) realizes a host interface which accesses the memory by generating an internal pulse each time accessed from the host. An RGB I/F circuit 48 realizes an RGB interface which writes moving picture RGB data into the memory using a dot clock signal. Note that only one of the host I/F circuit 46 and the RGB I/F circuit 48 may be provided.

A high-speed I/F circuit 120 (serial interface circuit) realizes high-speed serial transfer through a serial bus (high-speed serial bus). In more detail, the high-speed I/F circuit 120 realizes high-speed serial transfer between the integrated circuit device 10 and the host (host device) by current-driving or voltage-driving differential signal lines of the serial bus.

Figure 2A:
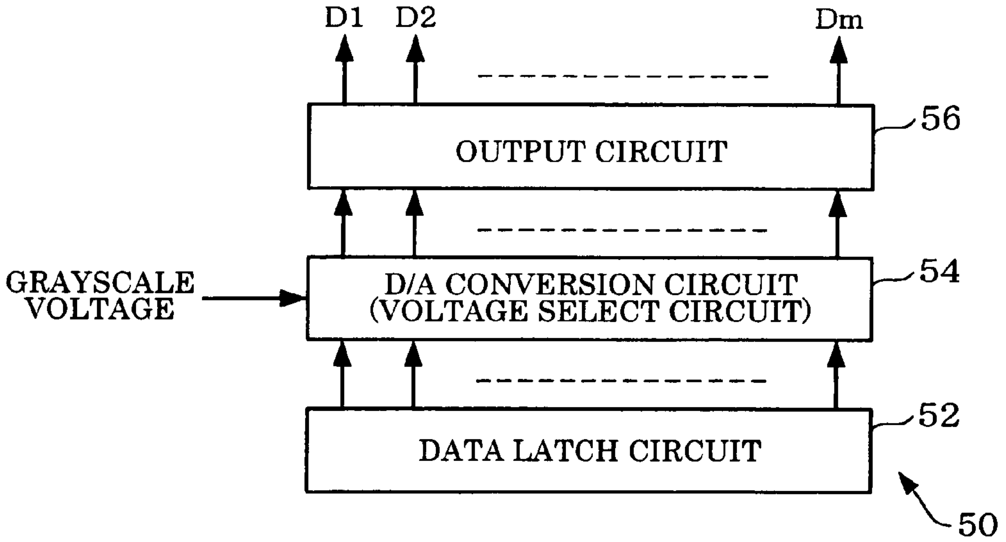
FIGS. 2A and 2B illustrate configuration examples of a data driver and a grayscale voltage generation circuit.

A data driver 50 is a circuit for driving a data line of the display panel. FIG. 2A shows a configuration example of the data driver 50. A data latch circuit 52 latches digital image data from the memory 20. A D/A conversion circuit 54 (voltage select circuit) performs D/A conversion of the digital image data latched by the data latch circuit 52, and generates an analog data voltage. In more detail, the data driver 50 receives a plurality of (e.g. 64 stages) grayscale voltages (reference voltages) from the grayscale voltage generation circuit 110, selects the voltage corresponding to the digital image data from the grayscale voltages, and outputs the selected voltage as the data voltage. An output circuit 56 (driver circuit or buffer circuit) buffers the data voltage from the D/A conversion circuit 54, and outputs the data voltage to the data line of the display panel to drive the data line. Part of the output circuit 56 (e.g. output stage of the operational amplifier) may not be provided in the data driver 50 and be disposed in another region.

A scan driver 70 is a circuit which generates a scan signal for driving a scan line of the display panel. In more detail, the scan driver 70 sequentially shifts a signal (enable input/output signal) using a shift register provided therein, and outputs a signal obtained by converting the level of the shifted signal to each scan line of the display panel as the scan signal (scan voltage). A scan address generation circuit and an address decoder may be included in the scan driver 70. The scan address generation circuit may generate and output a scan address, and the address decoder may decode the scan address to generate the scan signal.

The power supply circuit 90 is a circuit which generates various power supply voltages. In more detail, the power supply circuit 90 increases an input power source voltage or an internal power supply voltage by a charge-pump method using a boost capacitor and a boost transistor included in a voltage booster circuit provided in the power supply circuit 90. The power supply circuit 90 supplies the resulting voltage to the data driver 50, the scan driver 70, and the grayscale voltage generation circuit 110 as the power supply voltage.

Figure 2B:
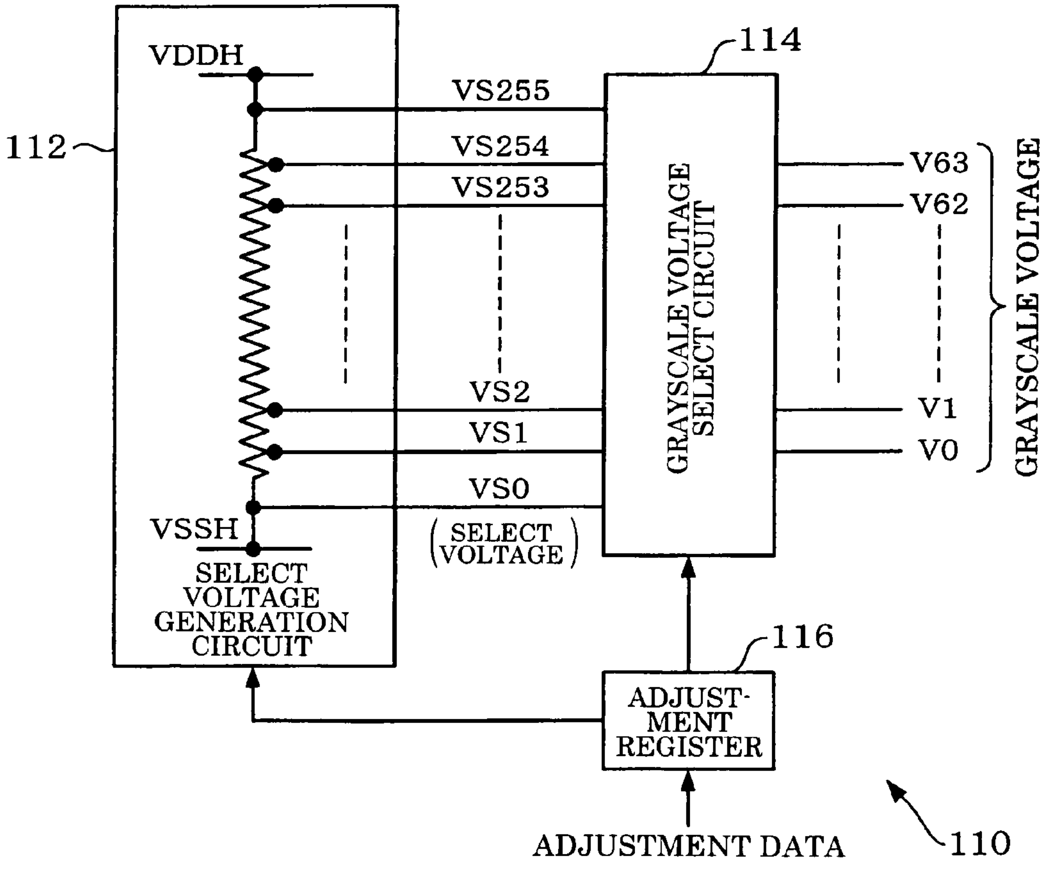

The grayscale voltage generation circuit (gamma control circuit) 110 is a circuit which generates the grayscale voltage. FIG. 2B shows a configuration example of the grayscale voltage generation circuit 110. A select voltage generation circuit 112 (voltage divider circuit) outputs select voltages VS0 to VS255 (R select voltages in a broad sense) based on high-voltage power supply voltages VDDH and VSSH generated by the power supply circuit 90. In more detail, the select voltage generation circuit 112 includes a ladder resistor circuit including a plurality of resistor elements connected in series. The select voltage generation circuit 112 outputs voltages obtained by dividing the power supply voltages VDDH and VSSH using the ladder resistor circuit as the select voltages VS0 to VS255. When the number of grayscales is 64, a grayscale voltage select circuit 114 selects 64 (S in a broad sense; R>S) voltages from the select voltages VS0 to VS255 based on the grayscale characteristic adjustment data set in an adjustment register 116 by the logic circuit 40, and outputs the selected voltages as grayscale voltages V0 to V63. This allows generation of grayscale voltages with grayscale characteristics (gamma correction characteristics) optimum for the display panel.

2. Configuration of High-speed I/F Circuit

Figure 3A:
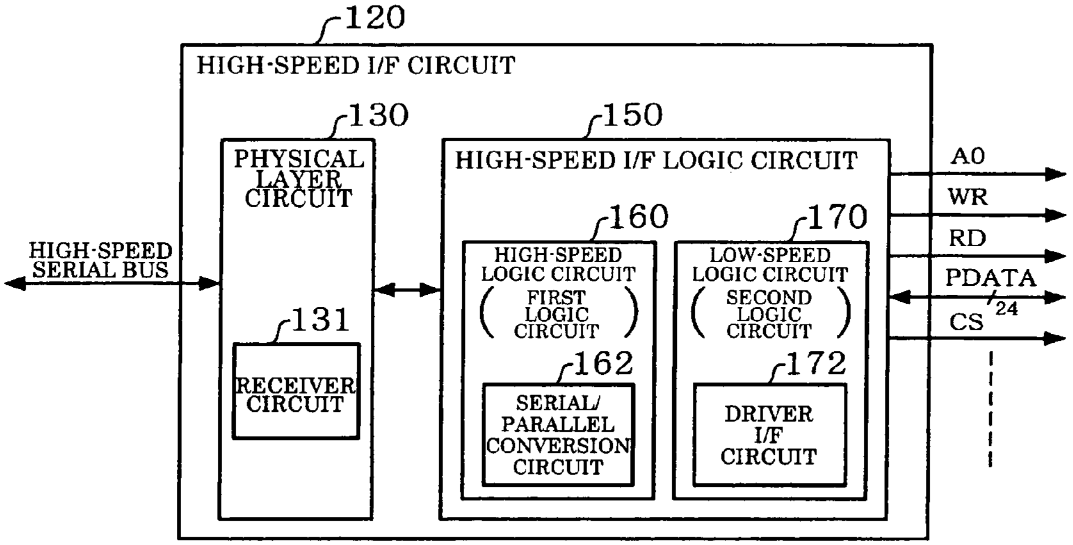
FIGS. 3A, 3B, and 3C illustrate configuration examples of a high-speed I/F circuit and a physical layer circuit.

The high-speed I/F circuit 120 (high-speed serial interface circuit) shown in FIG. 1 is a circuit which transfers serial data between the high-speed I/F circuit 120 and an external device (e.g. host processor) through a serial bus. FIG. 3A shows a configuration example of the high-speed I/F circuit 120. Note that the configuration of the high-speed I/F circuit 120 is not limited to the configuration shown in FIG. 3A. Some of the elements shown in FIG. 3A may be omitted, or an element other than the elements shown in FIG. 3A may be additionally provided.

A physical layer circuit 130 (analog front-end circuit or transceiver) is a circuit for receiving or transmitting data (packet) through a serial bus using differential signals (differential data signals, differential strobe signals, and differential clock signals) or the like. In more detail, the physical layer circuit 130 transmits or receives data by current-driving or voltage-driving differential signal lines of the serial bus. The physical layer circuit 130 includes a receiver circuit 131 which receives data through the serial bus. The physical layer circuit 130 may include a transmitter circuit which transmits data through the serial bus. The serial bus may have a multichannel configuration.

A high-speed I/F logic circuit 150 is a logic circuit provided in the high-speed I/F circuit 120, and includes a serial/parallel conversion circuit 162 which converts serial data received through the serial bus into parallel data. The high-speed I/F logic circuit 150 may perform processing of a link layer and a transaction layer which are higher-level layers of the physical layer. For example, the high-speed I/F logic circuit 150 analyzes a packet received by the physical layer circuit 130 through the serial bus, separates the header and data of the packet, and extracts the header. When transmitting a packet through the serial bus, the high-speed I/F logic circuit 150 generates the packet. In more detail, the high-speed I/F logic circuit 150 generates the header of the packet to be transmitted, and assembles the packet by combining the header and data. The high-speed I/F logic circuit 150 directs the physical layer circuit 130 to transmit the generated packet.

The high-speed I/F logic circuit 150 includes a high-speed logic circuit 160 and a low-speed logic circuit 170. The high-speed logic circuit 160 (first logic circuit in a broad sense) is a logic circuit which operates using a high-frequency clock signal. In more detail, the high-speed logic circuit 160 operates using a clock signal with a frequency equal to that of a transfer clock signal of the serial bus. The high-speed logic circuit 160 includes a serial/parallel conversion circuit 162. When the physical layer circuit 130 includes a transmitter circuit, the high-speed logic circuit 160 may include a parallel/serial conversion circuit. The high-speed logic circuit 160 may include another logic circuit (e.g. FIFO memory, elasticity buffer, or frequency divider circuit) which operates using a high-frequency clock signal equal to the transfer clock signal of the serial bus.

The low-speed logic circuit 170 (second logic circuit in a broad sense) is a logic circuit which operates using a clock signal with a frequency lower than that of an operating clock signal of the high-speed logic circuit 160. The low-speed logic circuit 170 includes a driver I/F circuit 172. The driver I/F circuit 172 performs interface processing between the high-speed I/F circuit 120 and the internal circuit (driver logic circuit 40 and host I/F circuit 46 in FIG. 1) of the display driver. In more detail, the driver I/F circuit 172 generates interface signals including an address 0 signal A0 (command/data identification signal), write signal WR, read signal RD, parallel data signal PDATA, chip select signal CS, and the like, and outputs the generated interface signals to the internal circuit of the display driver. Part or the entirety of the low-speed logic circuit 170 may be included in the driver logic circuit 40 in FIG. 1.

Figure 3B:
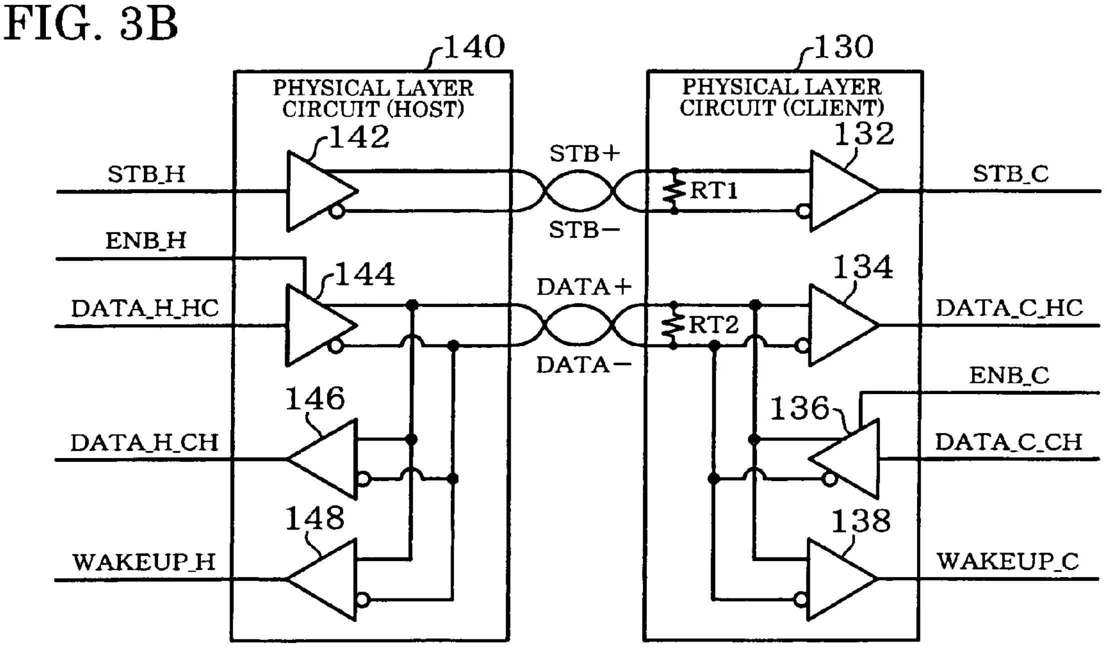

FIG. 3B shows a configuration example of the physical layer circuit. In FIG. 3B, a physical layer circuit 140 is provided in the host device, and the physical layer circuit 130 is provided in the display driver. Reference numerals 136, 142, and 144 indicate transmitter circuits, and reference numerals 132, 134, and 146 indicate receiver circuits. Reference numerals 138 and 148 indicate wakeup detection circuits. The host-side transmitter circuit 142 drives signals STB+/−. The client-side receiver circuit 132 amplifies the voltage across a resistor RTI generated by driving the signals STB+/−, and outputs a strobe signal STB_C to the circuit in the subsequent stage. The host-side transmitter circuit 144 drives signals DATA+/−. The client-side receiver circuit 134 amplifies the voltage across a resistor RT2 generated by driving the signals DATA+/−, and outputs a data signal DATA_C_HC to the circuit in the subsequent stage.

Figure 3C:
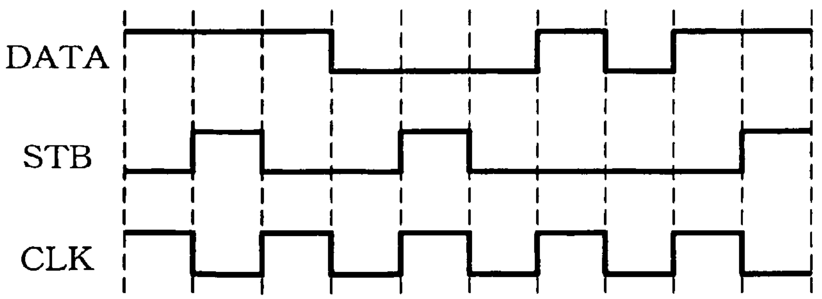

As shown in FIG. 3C, the transmitter side generates a strobe signal STB by calculating the exclusive OR of a data signal DATA and a clock signal CLK, and transmits the strobe signal STB to the receiver side through the high-speed serial bus. The receiver side calculates the exclusive OR of the data signal DATA and the strobe signal STB to reproduce the clock signal CLK.

Note that the configuration of the physical layer circuit is not limited to that shown in FIG. 3B. Various modifications and variations may be made such as those shown in FIGS. 4A and 4B.

Figure 4A:
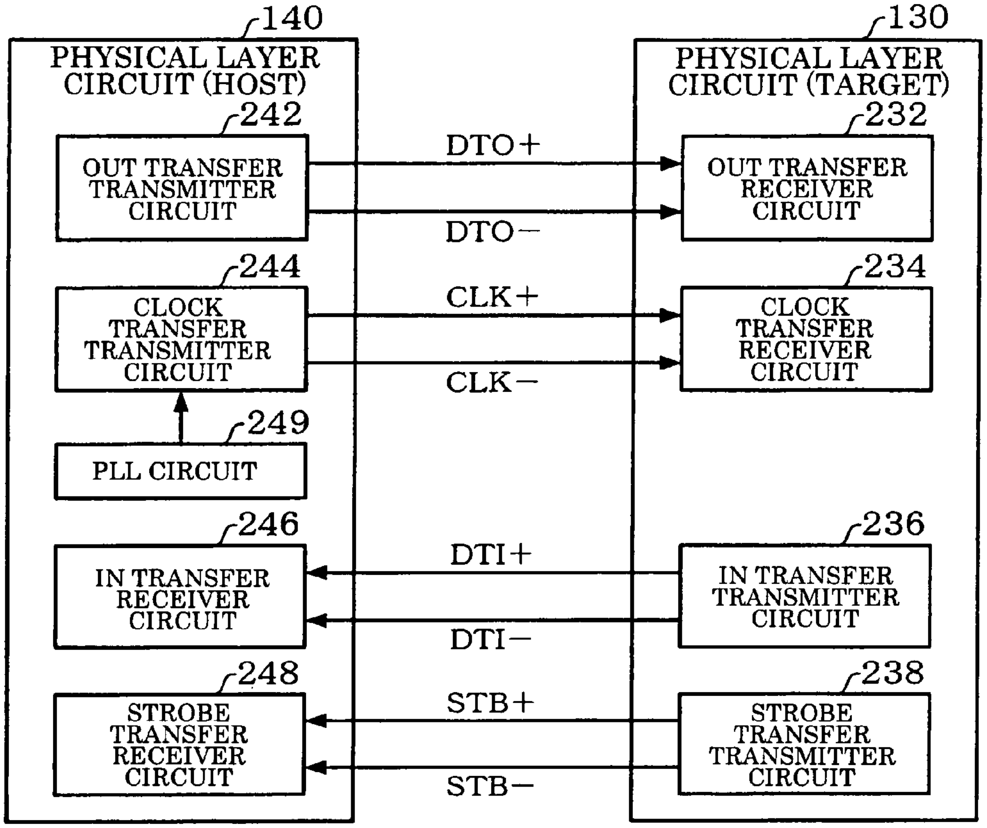
FIGS. 4A and 4B illustrate other configuration examples of the physical layer circuit.

In a first modification shown in FIG. 4A, DTO+ and DTO− indicate differential data signals (OUT data) output from a host-side transmitter circuit 242 to a target-side receiver circuit 232. CLK+ and CLK− indicate differential clock signals output from a host-side transmitter circuit 244 to a target-side receiver circuit 234. The host outputs the data signals DTO+/− in synchronization with the edge of the clock signals CLK+/−. Therefore, the target can sample and hold the data signals DTO+/− using the clock signals CLK+/−. In FIG. 4A, the target operates based on the clock signals CLK+/− supplied from the host. Specifically, the clock signals CLK+/− serve as a target-side system clock signal. Therefore, a PLL circuit 249 is provided in the host and is not provided in the target.

DTI+ and DTI− indicate differential data signals (IN data) output from a target-side transmitter circuit 236 to a host-side receiver circuit 246. STB+ and STB− indicate differential strobe signals output from a target-side transmitter circuit 238 to a host-side receiver circuit 248. The target generates and outputs the strobe signals STB+/− based on the clock signals CLK+/− supplied from the host. The target outputs the data signals DTI+/− in synchronization with the edge of the strobe signals STB+/−. Therefore, the host can sample and hold the data signals DTI+/− using the strobe signals STB+/−.

Figure 4B:
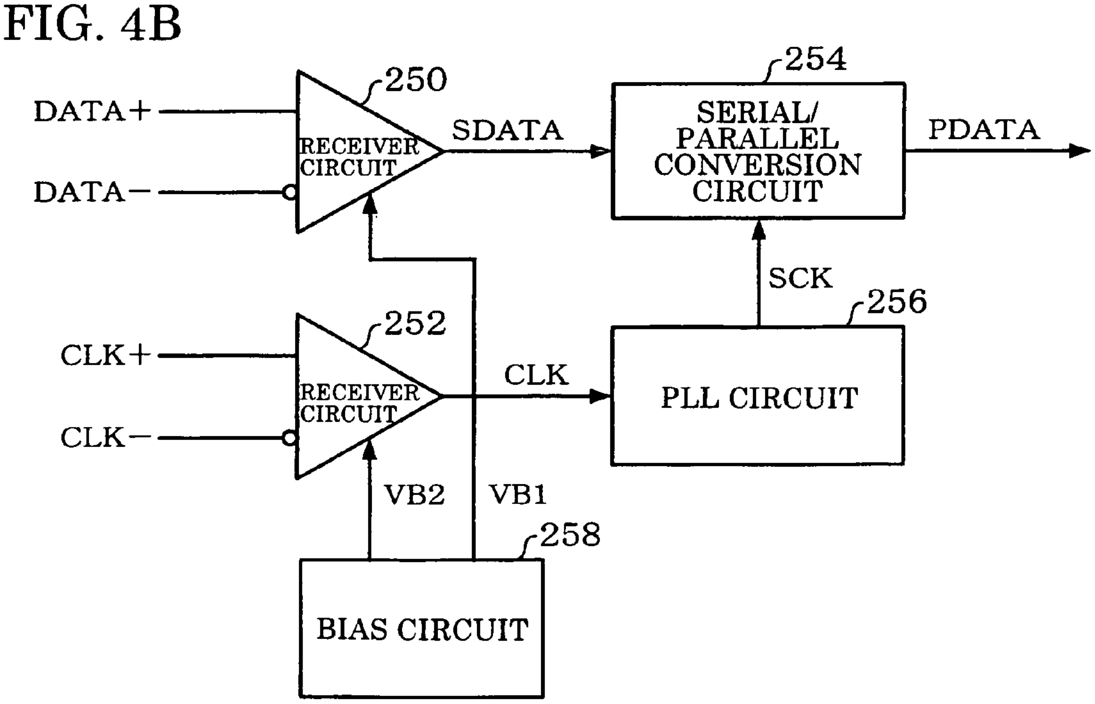

In a second modification shown in FIG. 4B, a data receiver circuit 250 receives the differential data signals DATA+ and DATA−. The receiver circuit 250 amplifies the voltage generated across a resistor element (not shown) provided between the signal lines for the data signals DATA+ and DATA−, and outputs the resulting serial data SDATA to a serial/parallel conversion circuit 254 included in the high-speed I/F logic circuit 150 in the subsequent stage. A clock signal receiver circuit 252 receives the differential clock signals CLK+ and CLK−. The receiver circuit 252 amplifies the voltage generated across a resistor element (not shown) provided between the signal lines for the clock signals CLK+ and CLK−, and outputs the resulting clock signal CLK to a phase locked loop (PLL) circuit 256 in the subsequent stage. The serial/parallel conversion circuit 254 samples the serial data SDATA from the data receiver circuit 250, converts the serial data SDATA into parallel data PDATA, and outputs the parallel data PDATA. The PLL circuit 256 outputs to the serial/parallel conversion circuit 254 a sampling clock signal SCK (multiphase sampling clock signals with the same frequency and different phases) for sampling the data received by the data receiver circuit 250 based on the clock signal CLK received by the clock signal receiver circuit 252. The serial/parallel conversion circuit 254 samples the serial data SDATA using the sampling clock signal, and outputs the parallel data PDATA. A bias circuit 258 generates bias voltages VB1 and VB2 for controlling a bias current, and supplies the generated bias voltages VB1 and VB2 to the receiver circuits 250 and 252.

In a portable telephone or the like, a host processor such as an MPU, BBE/APP, or image processing controller (display controller) is mounted on a first circuit board in a first instrument section of the portable telephone in which buttons for inputting a telephone number or characters are provided. The integrated circuit device 10 as the display driver is mounted on a second circuit board in a second instrument section of the portable telephone in which a display panel (LCD) or a camera device is provided.

In related-art technology, data is transferred between the host processor and the integrated circuit device 10 by a CMOS-voltage-level parallel transfer. Therefore, the number of interconnects passing through a connection section (e.g. hinge) which connects the first and second instrument sections is increased, whereby the degrees of freedom of the design may be impaired, or EMI noise may occur.

In FIGS. 3A to 4B, data is transferred between the host processor and the integrated circuit device 10 by a small-amplitude serial transfer. Therefore, the number of interconnects passing through the connection section between the first and second instrument sections can be reduced, and occurrence of EMI noise can be reduced.

3. Arrangement of High-speed I/F Circuit

The physical layer circuit 130 of the high-speed I/F circuit 120 described with reference to FIGS. 3A to 4B is formed using an analog circuit, and transfers data using the small-amplitude differential signals (may be single-end transfer), for example. Therefore, the operation of the analog circuit of the physical layer circuit 130 may be adversely affected by noise from the internal circuit (e.g. driver logic circuit) of the display driver, whereby the transmission quality may deteriorate. On the other hand, since the physical layer circuit 130 transfers data at a high transfer rate of 100 to 400 Mbps, noise which occurs in the physical layer circuit 130 may adversely affect the internal circuit of the display driver.

Figure 5A:
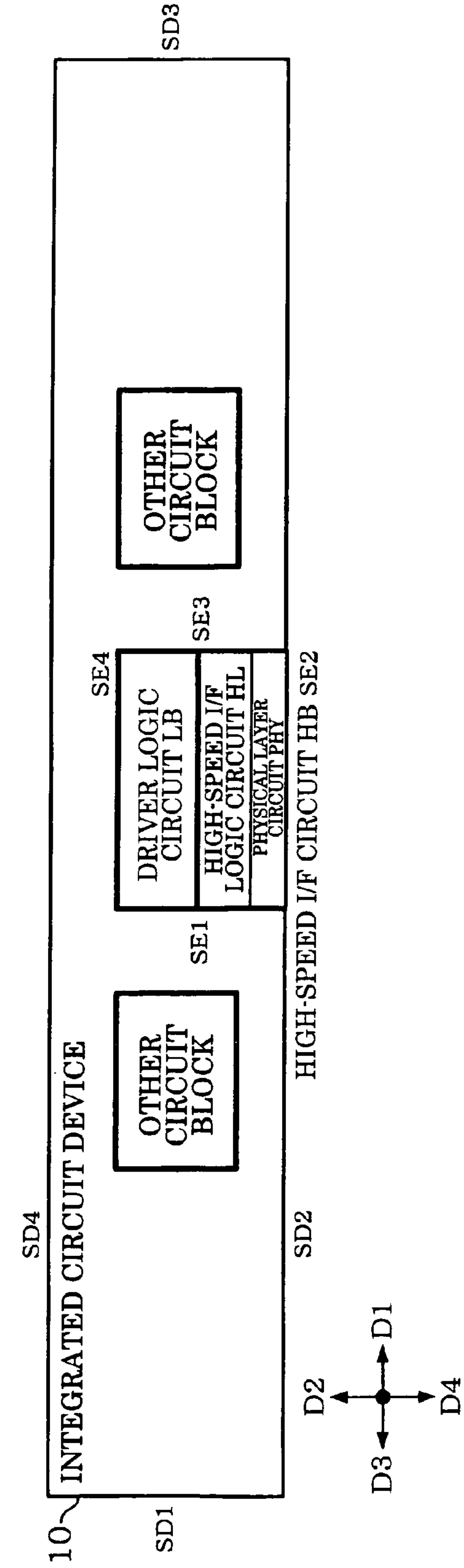
FIGS. 5A and 5B illustrate arrangement examples of an integrated circuit device according to one embodiment of the invention.
Figure 5B:
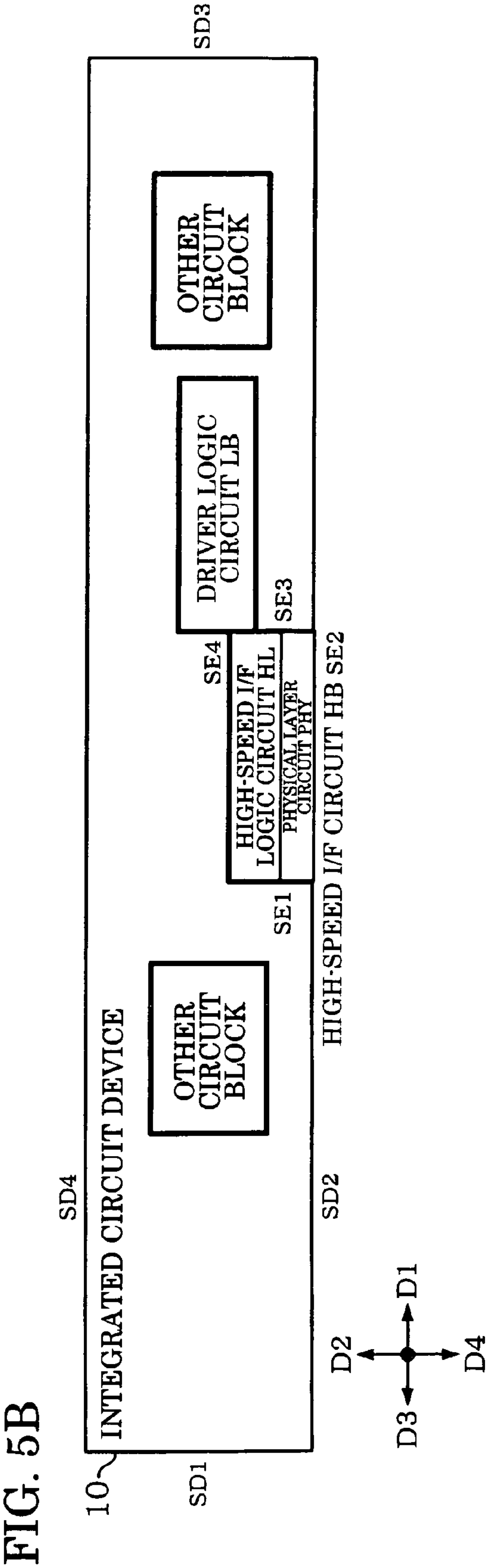

In this embodiment, the high-speed I/F circuit block HB is disposed using a method shown in FIGS. 5A and 5B. In FIGS. 5A and 5B, the integrated circuit device 10 includes a high-speed I/F circuit block HB (120 in FIG. 1) which transfers data through the serial bus, and a driver logic circuit block LB (40 in FIG. 1) which generates a display control signal. The high-speed I/F circuit block HB includes a physical layer circuit PHY (130 in FIG. 3A) and a high-speed I/F logic circuit HL (150 in FIG. 3A).

In this embodiment, as shown in FIGS. 5A and 5B, the high-speed I/F circuit block HB is disposed so that the high-speed I/F logic circuit HL (at least part of the high-speed I/F logic circuit HL) is disposed (interposed) between the physical layer circuit PHY and the driver logic circuit block LB and the physical layer circuit PHY and the driver logic circuit block LB are not adjacently disposed. In more detail, the high-speed I/F circuit block HB is disposed so that the high-speed I/F logic circuit HL and the driver logic circuit block LB are adjacently disposed and the physical layer circuit PHY and the driver logic circuit block LB are not adjacently disposed.

For example, the direction from a first side SD1 which is the short side of the integrated circuit device 10 toward a third side SD3 opposite to the first side SD1 is referred to as a first direction D1, and the direction from a second side SD2 which is the long side of the integrated circuit device 10 toward a fourth side SD4 opposite to the second side SD2 is referred to as a second direction D2, as shown in FIGS. 5A and 5B. FIGS. 5A and 5B illustrate the case where the left side is the first side SD1 and the right side is the third side SD3. Note that the right side may be the first side SD1 and the left side may be the third side SD3.

In FIG. 5A, the high-speed I/F logic circuit HL is disposed (adjacently disposed) on the direction D2 side of the physical layer circuit PHY. The driver logic circuit block LB is disposed (adjacently disposed) on the direction D2 side of the high-speed I/F logic circuit HL. This allows the physical layer circuit PHY, the high-speed I/F logic circuit HL, and the driver logic circuit block LB are arranged along the direction D2, so that the high-speed I/F logic circuit HL is interposed between the physical layer circuit PHY and the driver logic circuit block LB and the physical layer circuit PHY and the driver logic circuit block LB are not adjacently disposed.

In FIG. 5B, the high-speed I/F logic circuit HL is disposed on the direction D2 side of the physical layer circuit PHY. The driver logic circuit block LB is disposed on the direction D1 side of the high-speed I/F logic circuit HL. This also allows the high-speed I/F logic circuit HL to be interposed between the physical layer circuit PHY and the driver logic circuit block LB and the physical layer circuit PHY and the driver logic circuit block LB to be not adjacently disposed.

In FIGS. 5A and 5B, since the high-speed I/F logic circuit HL is interposed between the physical layer circuit PHY and the driver logic circuit block LB, the distance between the physical layer circuit PHY and the driver logic circuit block LB can be increased. Therefore, the physical layer circuit PHY is rarely adversely affected by noise which occurs in the driver logic circuit block LB, whereby the serial transfer transmission quality can be maintained. Moreover, the driver logic circuit block LB and the like are rarely adversely affected by noise which occurs in the physical layer circuit PHY, whereby malfunction and the like can be prevented.

In FIGS. 5A and 5B, a well in which the transistor of the physical layer circuit PHY is formed can be separated from a well in which the transistor of the high-speed I/F logic circuit HL is formed by employing a triple-well structure. Therefore, transmission of noise between the physical layer circuit PHY and the driver logic circuit block LB can be prevented by using the well in which the high-speed I/F logic circuit HL is formed as a barrier.

In FIGS. 5A and 5B, since the high-speed I/F logic circuit HL and the driver logic circuit block LB are adjacently disposed, signal lines can be easily provided (wired) between the high-speed I/F logic circuit HL and the driver logic circuit block LB. Specifically, the high-speed I/F logic circuit HL converts serial data from the serial bus into parallel data. Accordingly, since the 24-bit parallel data signal PDATA (R, G, and B are respectively eight bits) must be output from the high-speed I/F logic circuit HL to the driver logic circuit block LB, as shown in FIG. 3A, a large number of signal lines are provided between the high-speed I/F logic circuit HL and the driver logic circuit block LB. Therefore, when the high-speed I/F logic circuit HL and the driver logic circuit block LB are not adjacently disposed, the wiring region for a large number of signal lines between the high-speed I/F logic circuit HL and the driver logic circuit block LB forms a dead space, whereby the layout efficiency deteriorates.

In FIGS. 5A and 5B, since the high-speed I/F logic circuit HL and the driver logic circuit block LB are adjacently disposed, the signal lines between the high-speed I/F logic circuit HL and the driver logic circuit block LB can be provided along a short path. Therefore, a dead space can be minimized even if a large number of signal lines are provided between the high-speed I/F logic circuit HL and the driver logic circuit block LB, whereby the layout efficiency can be improved. This makes it possible to prevent the adverse effects of noise and improve the layout efficiency.

4. Central Arrangement of High-speed I/F Circuit Block

Figure 6A:
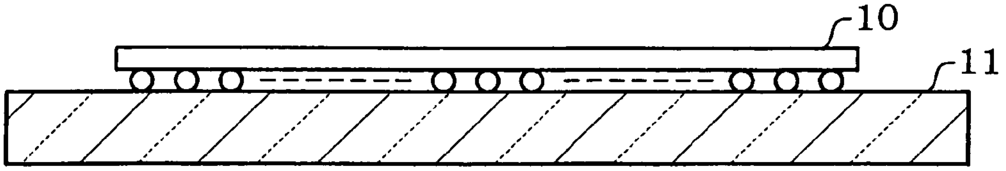
FIGS. 6A, 6B, and 6C are views illustrative of a bump contact resistance problem.

FIG. 6A illustrates a state when the integrated circuit device 10 is mounted on a glass substrate 11 using a chip on glass (COG) technology. In the COG mounting technology, the chip of the integrated circuit device 10 on which gold bumps or the like are formed is directly mounted face-down on the glass substrate 11 of the display panel. This allows the thickness of an LCD module to be reduced to the thickness of the LCD glass.

Figure 6B:
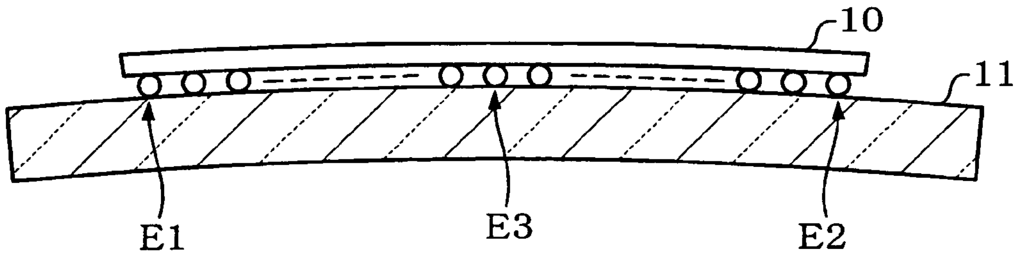
Figure 6C:
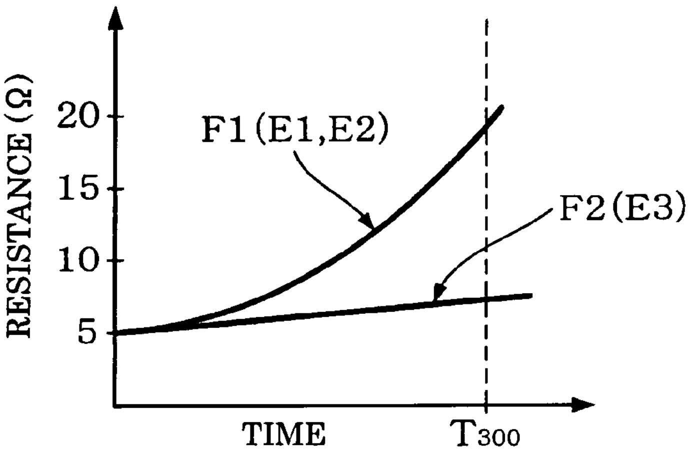

On the other hand, the contact resistance of the bumps is increased on the ends of the integrated circuit device 10 when mounting the integrated circuit device 10 using the COG mounting technology or the like. Specifically, the integrated circuit device 10 and the glass substrate 11 differ in coefficient of thermal expansion. Therefore, stress (thermal stress) caused by the difference in coefficient of thermal expansion is greater on the ends (E1 and E2) of the integrated circuit device 10 than at the center (E3) of the integrated circuit device 10. As a result, the contact resistance of the bumps is increased with time on the ends indicated by E1 and E2. As shown in FIG. 6C, when a temperature cycle test corresponding to the change over ten years is performed in 300 cycles, the contact resistance at the center indicated by E3 in FIG. 6B is increased from about five ohms to about seven ohms, as indicated by F2 in FIG. 6C. On the other hand, the contact resistance on the ends indicated by E1 and E2 in FIG. 6B is increased to about 20 ohms, as indicated by F1 in FIG. 6C. In particular, the narrower the integrated circuit device 10 (the higher the chip shape ratio SP=LD/W), the larger the difference in stress between the ends and the center, and the greater the increase in the contact resistance of the bumps on the ends.

In the high-speed I/F circuit, the impedance is matched between the transmitter side and the receiver side in order to prevent signal reflection. However, when the pads connected with the bumps on the ends of the integrated circuit device 10 are used as the pads (e.g. DATA+ and DATA−) of the high-speed I/F circuit, an impedance mismatch occurs due to an increase in the contact resistance of the bump indicated by F1. As a result, the signal quality of high-speed serial transfer deteriorates.

In the arrangement method shown in FIGS. 5A and 5B, the high-speed I/F circuit block HB is disposed near the center of the integrated circuit device 10 excluding the ends in order to solve such a problem. In more detail, a circuit block other than the high-speed I/F circuit block HB is disposed between the side SD1 of the integrated circuit device 10 and the high-speed I/F circuit block HB (side SE1 of the high-speed I/F circuit block HB). A circuit block other than the high-speed I/F circuit block HB is disposed between the side SD3 of the integrated circuit device 10 and the high-speed I/F circuit block HB (side SE3 of the high-speed I/F circuit block HB). As examples of the circuit block other than the high-speed I/F circuit block HB, a scan driver block, data driver block, memory block, driver logic circuit block, power supply circuit block, grayscale voltage generation circuit block, and the like can be given.

According to the arrangement method shown in FIGS. 5A and 5B, the high-speed I/F circuit block HB is not disposed on the ends of the integrated circuit device 10. Therefore, an impedance mismatch due to an increase in the contact resistance, as indicated by F1 in FIG. 6C, can be reduced, whereby deterioration of the high-speed serial transfer signal quality can be reduced.

5. Integration into Macroblock and Power Supply Interconnect

In FIG. 7A, the high-speed I/F circuit block HB is formed as a macroblock including a pad region PDR. For example, the high-speed I/F circuit block HB is a hard macro in which routing (wiring) and circuit cell placement (arrangement) are fixed. In more detail, routing and circuit cell placement are achieved by a manual layout (part of routing and placement may be automated). The pads (electrodes) in the high-speed I/F circuit block HB are also placed by a manual layout, and the pad positions are fixed in the hard macro.

Figure 7:
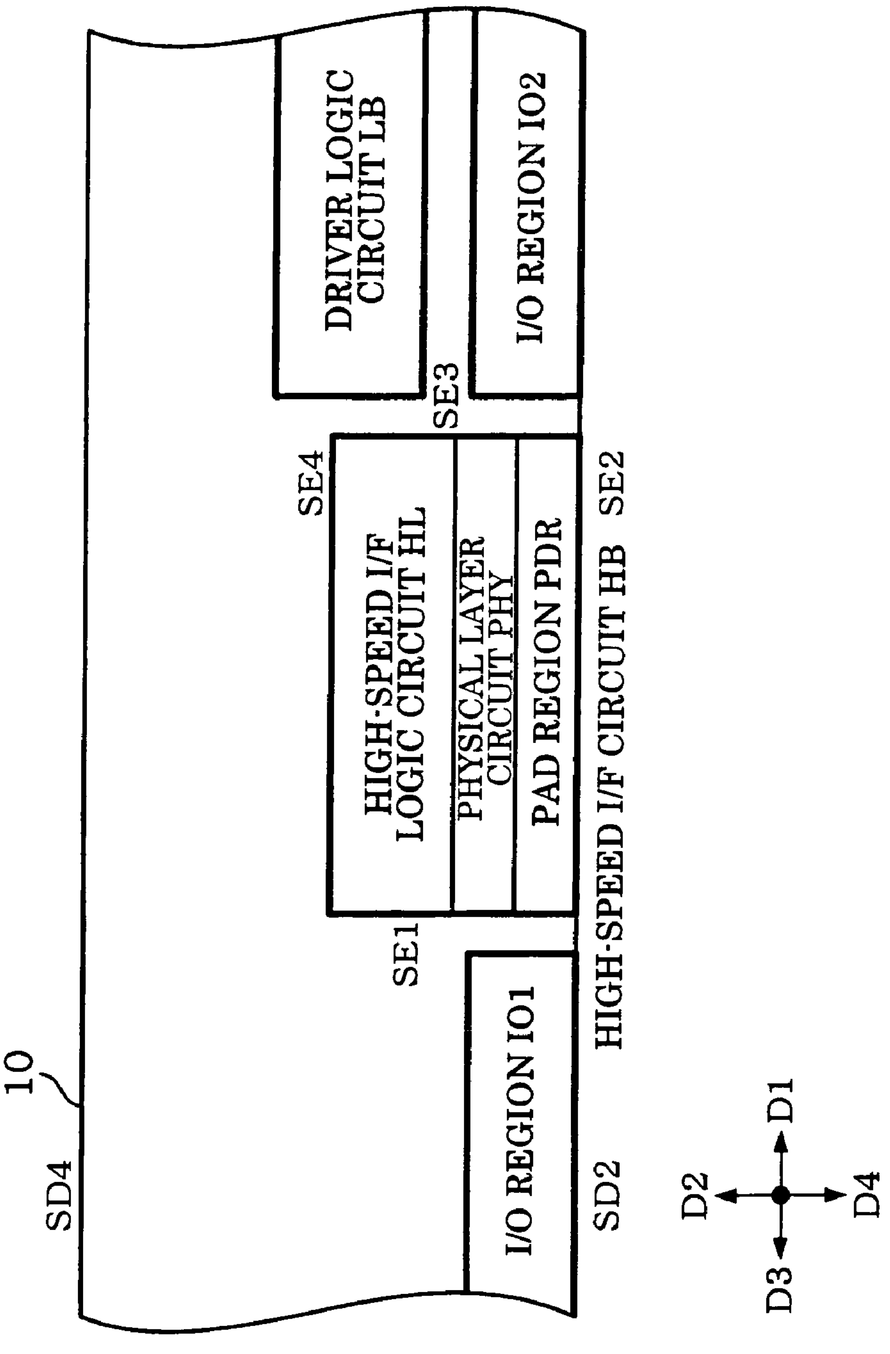
FIG. 7 is a view illustrative of an arrangement method for an integrated circuit device.

In FIG. 7, the high-speed IF circuit block HB is disposed so that the side SD2 which is the long side of the integrated circuit device 10 coincides (almost coincides) with the side SE2 which is the long side of the high-speed I/F circuit block HB. When the direction from the side SE2 toward the side SE4 is referred to as the direction D2, the pad region PDR, the physical layer circuit PHY, and the high-speed I/F logic circuit HL are disposed side by side along the direction D2. This makes it possible to increase the distance between the driver logic circuit block LB disposed on the direction D2 side of an I/O region IO2 (interface region) and the physical layer circuit PHY, as shown in FIG. 7. Therefore, the high-speed I/F circuit block HB can be easily disposed (arranged) so that the driver logic circuit block LB and the physical layer circuit PHY are not adjacently disposed.

Figure 8:
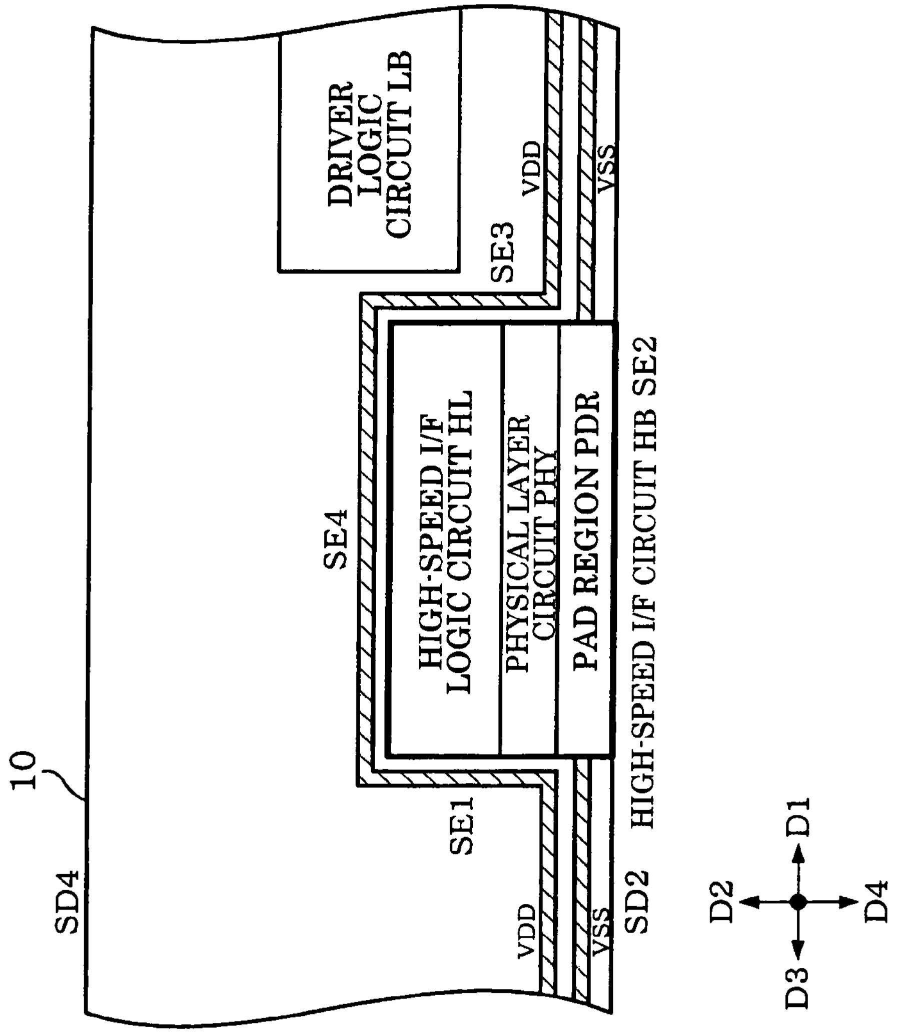
FIG. 8 is another view illustrative of an arrangement method for an integrated circuit device.

In FIG. 8, a power supply line VDD (second power supply line) for supplying power to the circuit block (e.g. driver logic circuit block LB) other than the high-speed I/F circuit block HB is provided along three sides SE1, SE4, and SE3 of the rectangular region of the high-speed I/F circuit block HB so that the power supply line VDD avoids the rectangular region when viewed from the top side. The sides SE1 and SE3 are the short sides of the high-speed I/F circuit block HB. The side SE4 is the side of the high-speed I/F circuit block HB opposite to the long side SE2 which coincides with the long side SD2 of the integrated circuit device 10.

According to the arrangement method shown in FIG. 8, not only the high-speed I/F logic circuit HL, but also the wiring region of the power supply line VDD is interposed between the physical layer circuit PHY and the driver logic circuit block LB. Therefore, the distance between the physical layer circuit PHY and the driver logic circuit block LB can be further increased, whereby transmission of noise between the physical layer circuit PHY and the driver logic circuit block LB can be further reduced. A signal line other than the power supply line VDD may also be provided between the high-speed I/F circuit block HB and the driver logic circuit block LB.

As shown in FIG. 8, a power supply line VSS (first power supply line) of the power supply lines VDD and VSS for supplying power to other circuit blocks may be provided to pass through the high-speed I/F circuit block HB instead of providing the power supply line VSS to avoid the high-speed I/F circuit block HB, differing from the power supply line VDD. In order to reduce the adverse effects of noise, it is preferable to employ a triple-well structure to isolate the well in which the transistor of the high-speed I/F circuit block HB is formed, for example. In order to reduce noise generated by the physical layer circuit PHY and reduce transmission of noise from other circuit blocks, it is preferable to form a diffusion region (diffusion region of second conductivity type such as P+region; guard ring) for stabilizing the potential of the substrate (substrate of second conductivity type such as P-type substrate) in the substrate in the high-speed I/F circuit block HB. In more detail, a ring-shaped diffusion region is formed to enclose the high-speed I/F circuit block HB. Or, it is preferable to form a diffusion region to enclose the well (well of first conductivity type such as N well) in which the transistor of the high-speed I/F circuit block HB is formed.

In this case, the power supply line VSS can be electrically connected with the diffusion region (guard ring) for stabilizing the potential of the substrate by providing the power supply line VSS in the high-speed I/F circuit block HB. Therefore, the potential of the substrate in the high-speed I/F circuit block HB can be stabilized, whereby noise generated by the physical layer circuit PHY and transmission of noise from other circuit blocks can be reduced.

6. Detailed Arrangement Example

Figure 9A:
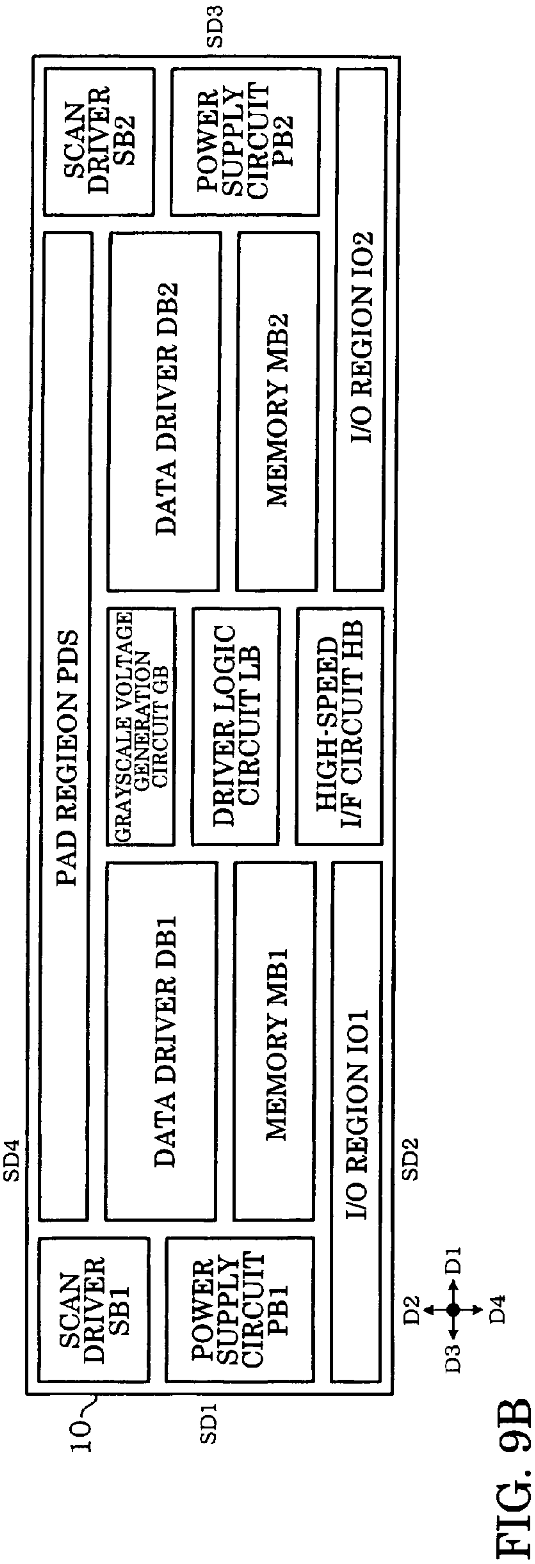
Figure 9B:
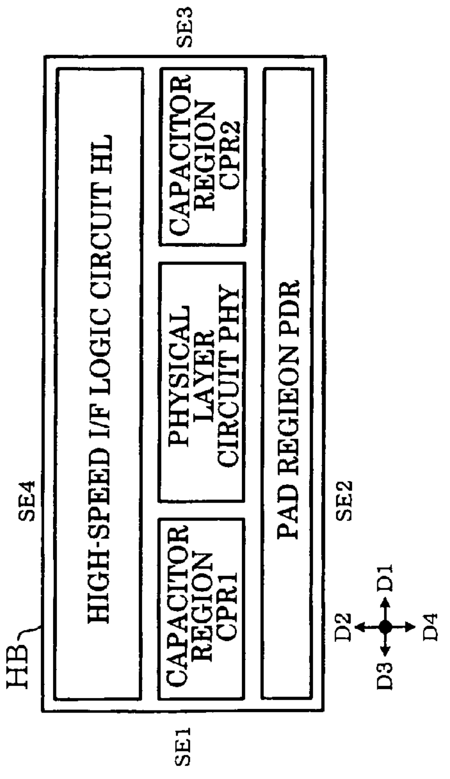

FIGS. 9A and 9B illustrate a detailed first arrangement example of the integrated circuit device 10 and the high-speed I/F circuit block HB. The first arrangement example is a detailed example of the arrangement shown in FIG. 5A.

As shown in FIG. 9A, the integrated circuit device 10 includes the high-speed I/F circuit block HB and the driver logic circuit block LB. The integrated circuit device 10 also includes a grayscale voltage generation circuit block GB which generates the grayscale voltage, and data driver blocks DB1 and DB2 which drive the data lines of the display panel based on the generated grayscale voltage. The integrated circuit device 10 also includes memory blocks MB1 and MB2 which store image data which is grayscale data, scan driver blocks SB1 and SB2 which drive the scan line of the display panel, and power supply circuit blocks PB1 and PB2 which generates power supply voltages. The integrated circuit device 10 further includes I/O regions IO1 and IO2 and a pad region PDS (pad region for data lines and scan lines).

As shown in FIG. 9A, the high-speed I/F circuit block HB and the driver logic circuit block LB are adjacently disposed. In more detail, when the direction from the side SD2 toward the side SD4 is referred to as the direction D2, the high-speed I/F circuit block HB and the driver logic circuit block LB are adjacently disposed along the direction D2. The driver logic circuit block LB and the grayscale voltage generation circuit block GB are also adjacently disposed. In more detail, the driver logic circuit block LB and the grayscale voltage generation circuit block GB are adjacently disposed along the direction D2.

In FIG. 9A, the grayscale voltage generation circuit block GB and the data driver blocks DB1 and DB2 are adjacently disposed. In more detail, when the direction from the side SD1 toward the side SD3 is referred to as the direction D1, the grayscale voltage generation circuit block GB and the data driver blocks DB1 and DB2 are adjacently disposed along the direction D1.

In FIG. 2B, the driver logic circuit block LB sets adjustment data for grayscale voltage amplitude adjustment, grayscale characteristic slope adjustment, grayscale characteristic fine adjustment, and the like in the adjustment register 116, for example. Optimum grayscale characteristics (gamma characteristics) corresponding to the type of display panel can be obtained by setting the adjustment data, whereby the display quality can be improved.

On the other hand, the number of bits of the adjustment data used for such adjustments is very large. Therefore, the number of adjustment data signal lines from the driver logic circuit block LB to the grayscale voltage generation circuit block GB is also large. As a result, when the driver logic circuit block LB and the grayscale voltage generation circuit block GB are not adjacently disposed, the chip area may be increased due to the wiring region for the adjustment data signal lines.

In FIG. 9A, the driver logic circuit block LB and the grayscale voltage generation circuit block GB are adjacently disposed along the direction D2. This allows the adjustment data signal lines from the driver logic circuit block LB to be connected with the grayscale voltage generation circuit block GB along a short path, whereby an increase in the chip area due to the wiring region can be prevented.

As shown in FIG. 2A, the D/A conversion circuit 54 included in the data driver receives the grayscale voltages V0 to V63 from the grayscale voltage generation circuit 110. The D/A conversion circuit 54 performs D/A conversion of grayscale data by selecting the voltage corresponding to the grayscale data from the grayscale voltages V0 to V64. Therefore, the number of signal lines for the grayscale voltages V0 to V63 from the grayscale voltage generation circuit block GB to the data driver blocks DB1 and DB2 is also large. As a result, when the grayscale voltage generation circuit block GB and the data driver blocks DB1 and DB2 are not adjacently disposed, the chip area may be increased due to the wiring region for the grayscale voltage signal lines.

In FIG. 9A, the grayscale voltage generation circuit block GB and the data driver blocks DB1 and DB2 are adjacently disposed along the direction D1. This allows the grayscale voltage signal lines from the grayscale voltage generation circuit block GB to be connected with the data driver blocks DB1 and DB2 along a short path, whereby an increase in the chip area due to the wiring region can be prevented.

As shown in FIG. 9B, the high-speed I/F circuit block HB includes the pad region PDR, the physical layer circuit PHY, the high-speed I/F logic circuit HL, and capacitor regions CPR1 and CPR2. In FIG. 9B, the pad region PDR, the physical layer circuit PHY, the high-speed I/F logic circuit HL are disposed along the direction D2 from the side SE2 toward the side SE4.

In FIG. 9B, the physical layer circuit PHY is disposed near the center of the high-speed I/F circuit block HB excluding the ends. In more detail, the physical layer circuit PHY is disposed so that the first capacitor region CPR1 (first region in a broad sense) is formed between the side SE1 of the high-speed I/F circuit block HB and the physical layer circuit PHY and the second capacitor region CPR2 (second region in a broad sense) is formed between the side SE3 of the high-speed I/F circuit block HB and the physical layer circuit PHY. Capacitors for stabilizing power supplied to the physical layer circuit PHY and the like are formed in the capacitor regions CPR1 and CPR2.

Figure 10A:
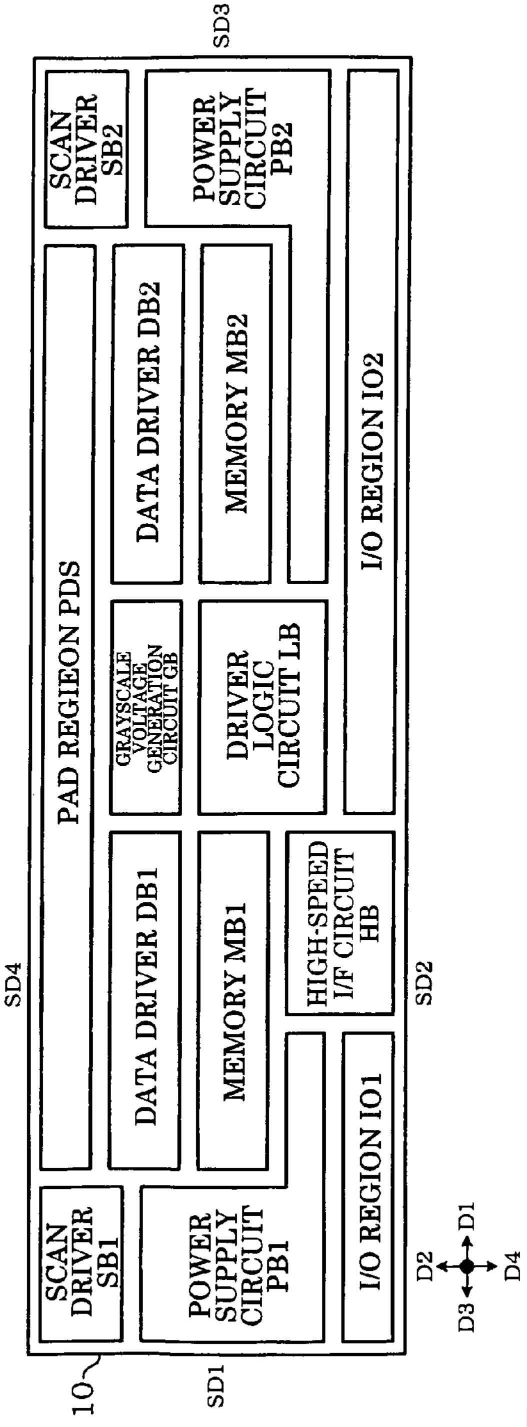

A second arrangement example shown in FIG. 10A is a detailed example of the arrangement shown in FIG. 5B. In FIG. 10A, the high-speed I/F circuit block HB and the driver logic circuit block LB are adjacently disposed. In more detail, the high-speed I/F circuit block HB and the driver logic circuit block LB are adjacently disposed along the direction D1. The driver logic circuit block LB and the grayscale voltage generation circuit block GB are also adjacently disposed. In more detail, the driver logic circuit block LB and the grayscale voltage generation circuit block GB are adjacently disposed along the direction D2. Since the adjustment data signal lines from the driver logic circuit block LB can be connected with the grayscale voltage generation circuit block GB along a short path by adjacently disposing the driver logic circuit block LB and the grayscale voltage generation circuit block GB, whereby an increase in the chip area due to the wiring region can be prevented.

Figure 10B:
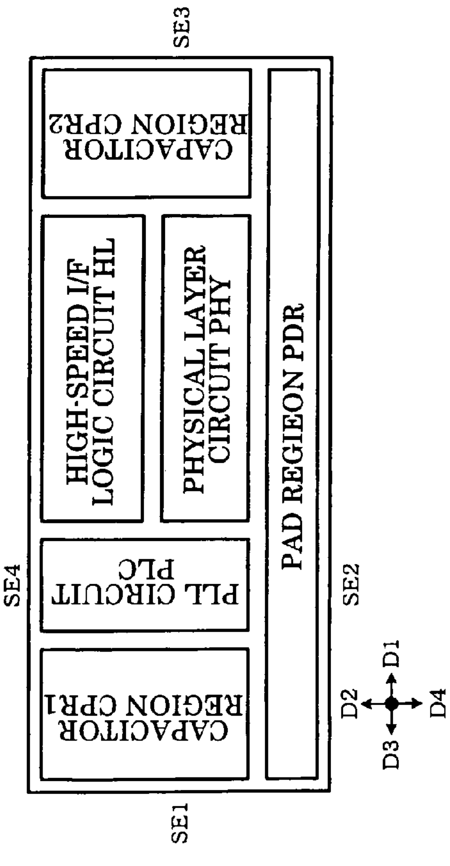

In FIG. 10B, the grayscale voltage generation circuit block GB and the data driver blocks DB1 and DB2 are adjacently disposed along the direction D1. Since the grayscale voltage signal lines from the grayscale voltage generation circuit block GB can be connected with the data driver blocks DB1 and DB2 along a short path by adjacently disposing the grayscale voltage generation circuit block GB and the data driver blocks DB1 and DB2, whereby an increase in the chip area due to the wiring region can be prevented.

As shown in FIG. 10B, the high-speed I/F circuit block HB includes the pad region PDR, the physical layer circuit PHY, the high-speed I/F logic circuit HL, a PLL circuit PLC, and the capacitor regions CPR1 and CPR2. In FIG. 10B, the physical layer circuit PHY is disposed near the center of the high-speed I/F circuit block HB excluding the ends. In more detail, the first capacitor region CPR1 is formed between the side SEI of the high-speed I/F circuit block HB and the physical layer circuit PHY, and the second capacitor region CPR2 is formed between the side SE3 of the high-speed I/F circuit block HB and the physical layer circuit PHY.

The capacitor region CPR2 is interposed between the physical layer circuit PHY and the driver logic circuit block LB by disposing the physical layer circuit PHY as described above. Therefore, the distance between the physical layer circuit PHY and the driver logic circuit block LB can be increased, whereby transmission of noise generated by the driver logic circuit block LB to the physical layer circuit PHY or transmission of noise generated by the physical layer circuit PHY to the driver logic circuit block LB can be prevented. Therefore, the serial transfer transmission quality can be maintained, and malfunction can be prevented.

The regions CPR1 and CPR2 formed either side of the physical layer circuit PHY are not limited to the capacitor formation regions, but may be regions in which other circuits and elements are formed.

7. Narrow Integrated Circuit Device

In the arrangement methods shown in FIGS. 9A and 10A, the memory blocks MB1 and MB2 and the data driver blocks DB1 and DB2 are disposed along the direction D2. The memory blocks MB1 and MB2 and the data driver blocks DB1 and DB2 are ultra-flat blocks in which the length along the direction D1 is longer than the width along the direction D2.

Image data from the host is written into the memory blocks MB1 and MB2. The data driver blocks DB1 and DB2 convert the digital image data written into the memory blocks MB1 and MB2 into analog data voltages and drive the data lines of the display panel. In FIGS. 9A and 10A, the image data signal flows in the direction D2. Therefore, the memory blocks MB1 and MB2 and the data driver blocks DB1 and DB2 are disposed along the direction D2 corresponding to the signal flow.

On the other hand, the arrangement methods shown in FIGS. 9A and 10A have the following problems.

A reduction in chip size is required for an integrated circuit device such as a display driver in order to reduce cost. However, when the chip size is reduced by merely shrinking the integrated circuit device using a microfabrication technology, the size of the integrated circuit device is reduced not only in the short side direction but also in the long side direction. This makes it difficult to mount the integrated circuit device due to the narrow pitch.

Second, the configurations of the memory and the data driver of the display driver are changed corresponding to the type of display panel (amorphous TFT or low-temperature polysilicon TFT), the number of pixels (QCIF, QVGA, or VGA), the specification of the product, and the like. Therefore, in the arrangement methods shown in FIGS. 9A and 10A, even if the pad pitch, the cell pitch of the memory, and the cell pitch of the data driver coincide in a certain product, the pitches do not coincide when the configurations of the memory and the data driver are changed. If the pitches do not coincide, an unnecessary wiring region must be formed between the circuit blocks in order to absorb the difference in pitch. As a result, the width W of the integrated circuit device 10 in the direction D2 is increased, whereby cost is increased due to an increase in the chip area. If the layout of the memory and the data driver is changed so that the pad pitch coincides with the cell pitch in order to avoid such a situation, the development period is increased, whereby cost is increased.

Figure 11:
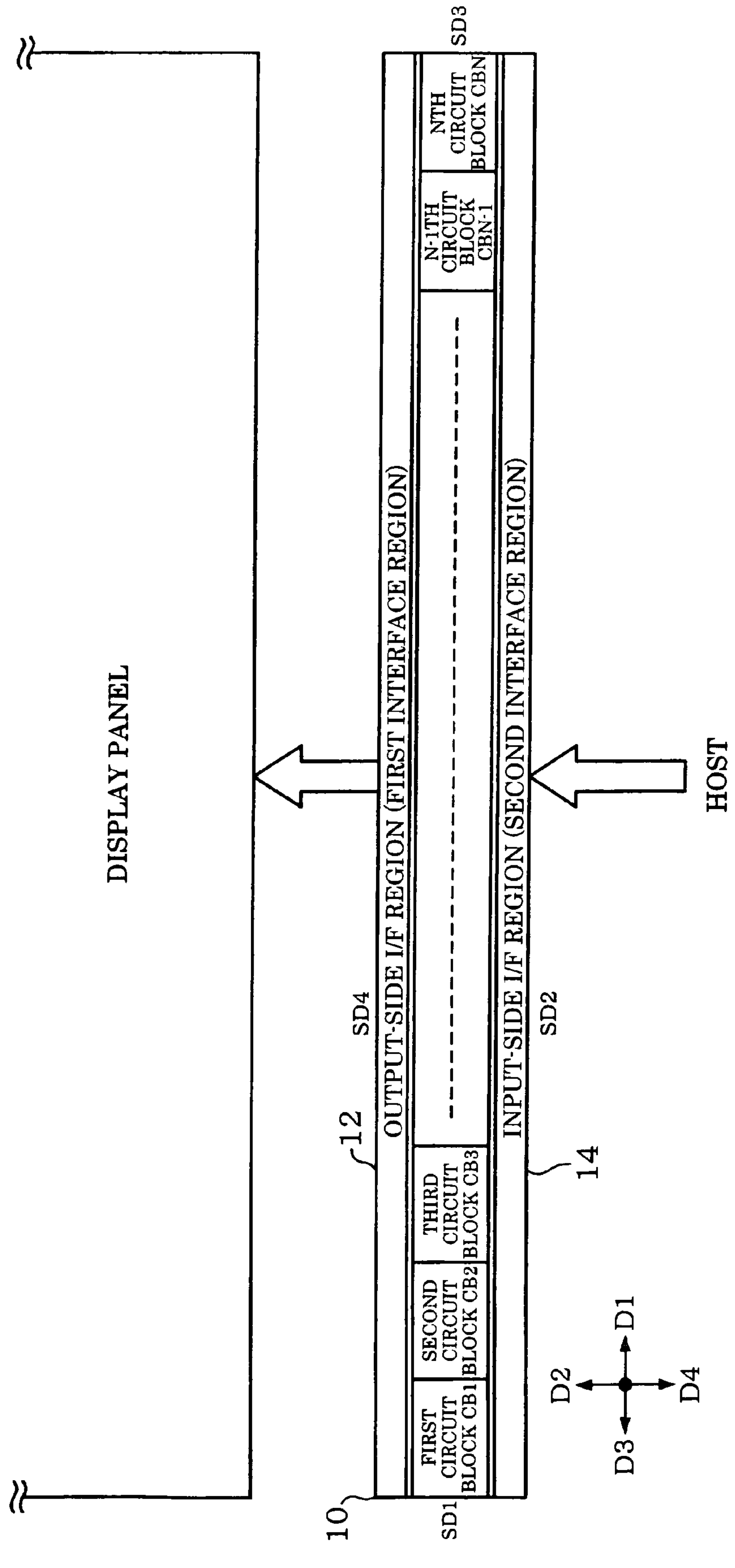
FIG. 11 is a view illustrative of an arrangement method which realizes a narrow integrated circuit device.

FIG. 11 shows an arrangement example of the integrated circuit device 10 which can solve the above problems. The integrated circuit device 10 includes first to Nth circuit blocks CB1 to CBN (N is an integer of two or more) disposed along the direction D1. Specifically, while the circuit blocks are arranged along the direction D2 in FIGS. 9A and 10A, the circuit blocks CB1 to CBN are arranged along the direction D1 in FIG. 11. Each circuit block is a relatively square block instead of an ultra-flat block.

The integrated circuit device 10 includes an output-side I/F region 12 (first interface region in a broad sense) provided along the side SD4 on the direction D2 side of the first to Nth circuit blocks CB1 to CB. The integrated circuit device 10 also includes an input-side I/F region 14 (second interface region in a broad sense) provided along the side SD2 on the direction D4 side of the first to Nth circuit blocks CB1 to CBN. In more detail, the output-side I/F region 12 (first I/O region) is disposed on the direction D2 side of the circuit blocks CB1 to CBN without other circuit blocks or the like interposed therebetween, for example. The input-side I/F region 14 (second I/O region) is disposed on the direction D2 side of the circuit blocks CB1 to CBN without other circuit blocks or the like interposed therebetween, for example. Specifically, only one circuit block (data driver block) exists in the direction D2 in the area in which at least the data driver block exists. When the integrated circuit device 10 is used as an intellectual property (IP) core and incorporated into another integrated circuit device, at least one of the I/F regions 12 and 14 may be omitted from the integrated circuit device 10.

The output-side (display panel side) I/F region 12 is a region which serves as an interface between the integrated circuit device 10 and the display panel, and includes pads and various elements connected with the pads, such as output transistors and protective elements. In more detail, the output-side I/F region 12 includes output transistors for outputting the data signal to the data line and outputting the scan signal to the scan line, for example. When the display panel is a touch panel or the like, the output-side I/F region 12 may include input transistors.

The input-side I/F (host side) region 14 is a region which serves as an interface between the integrated circuit device 10 and a host (MPU, image processing controller, or baseband engine), and may include pads and various elements connected with the pads, such as input (input/output) transistors, output transistors, and protective elements. In more detail, the input-side I/F region 14 includes input transistors for inputting a signal (digital signal) from the host, output transistors for outputting a signal to the host, and the like.

An output-side or input-side I/F region may be provided along the short side SD1 or SD3. Bumps which serve as external connection terminals or the like may be provided in the I/F (interface) regions 12 and 14, or may be provided in the region (first to Nth circuit blocks CB1 to CBN) other than the I/F regions 12 and 14. When providing the bumps in the region other than the I/F regions 12 and 14, the bumps are formed using a small bump technology (e.g. bump technology using a resin core) other than a gold bump technology.

The first to Nth circuit blocks CB1 to CBN may include at least two (or three) different circuit blocks (circuit blocks having different functions). For example, when the integrated circuit device 10 is a display driver, the circuit blocks CB1 to CBN may include at least two of a data driver block, memory block, scan driver block, logic circuit block, grayscale voltage generation circuit block, and power supply circuit block. In more detail, the circuit blocks CB1 to CBN may include at least a data driver block and a logic circuit block, and may further include a grayscale voltage generation circuit block. When the integrated circuit device 10 includes a built-in memory, the circuit blocks CB1 to CBN may further include a memory block.

FIG. 12 shows an example of various types of display drivers and circuit blocks provided in the display drivers. In an amorphous thin film transistor (TFT) panel display driver including a built-in memory (RAM), the circuit blocks CB1 to CBN may include a memory block, a data driver (source driver) block, a scan driver (gate driver) block, a logic circuit (gate array circuit) block, a grayscale voltage generation circuit (gamma correction circuit) block, and a power supply circuit block. In a low-temperature polysilicon (LTPS) TFT panel display driver including a built-in memory, since the scan driver can be formed on a glass substrate, the scan driver block may be omitted. The memory block may be omitted in an amorphous TFT panel display driver which does not include a memory, and the memory block and the scan driver block may be omitted in a low-temperature polysilicon TFT panel display driver which does not include a memory. In a collar super twisted nematic (CSTN) panel display driver and a thin film diode (TFD) panel display driver, the grayscale voltage generation circuit block may be omitted.

Figure 13A:
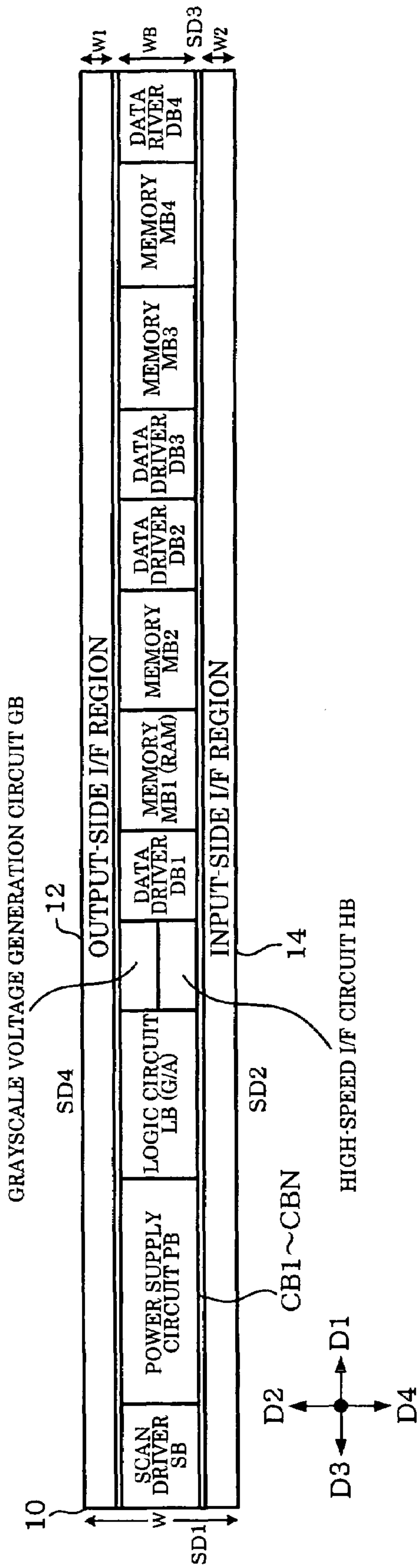
FIGS. 13A and 13B illustrate detailed arrangement examples of an integrated circuit device.
Figure 13B:
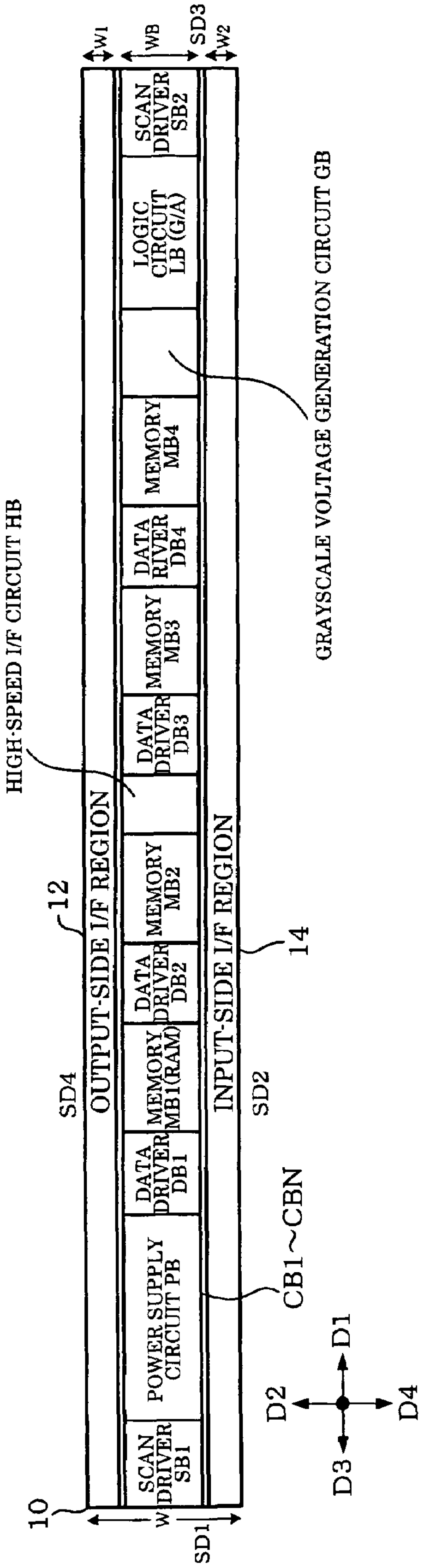

FIGS. 13A and 13B illustrate detailed examples of the planar layout of the integrated circuit device 10. In FIGS. 13A and 13B, the first to Nth circuit blocks CB1 to CBN include first to fourth memory blocks MB1 to MB4 (first to Nth memory blocks in a broad sense; I is an integer of two or more). The first to Nth circuit blocks CB1 to CBN also include first to fourth data driver blocks DB1 to DB4 (first to Ith data driver blocks in a broad sense) respectively disposed adjacent to the first to fourth memory blocks MB1 to MB4 along the direction D1. In more detail, the memory block MB1 and the data driver block DB1 are adjacently disposed along the direction D1, and the memory block MB2 and the data driver block DB2 are adjacently disposed adjacent along the direction D1. The memory block MB1 adjacent to the data driver block DB1 stores image data (display data) used by the data driver block DB1 to drive the data line, and the memory block MB2 adjacent to the data driver block DB2 stores image data used by the data driver block DB2 to drive the data line.

The layout arrangement of the integrated circuit device 10 according to this embodiment is not limited to those shown in FIGS. 13A and 13B. For example, the number of memory blocks and data driver blocks may be two, three, or five or more, or the memory block and the data driver block may not be divided into blocks. A modification is also possible in which the memory block is not adjacent to the data driver block. A configuration is also possible in which the memory block, the scan driver block, the power supply circuit block, or the grayscale voltage generation circuit block is not provided. A circuit block with a significantly small width in the direction D2 (narrow circuit block with a width equal to or less than the width W) may be provided between the circuit blocks CB1 to CBN and the output-side I/F region 12 or the input-side I/F region 14. The circuit blocks CB1 to CBN may include a circuit block in which different circuit blocks are arranged in stages along the direction D2. For example, the scan driver circuit and the power supply circuit may be integrated in one circuit block.

Figure 14A:
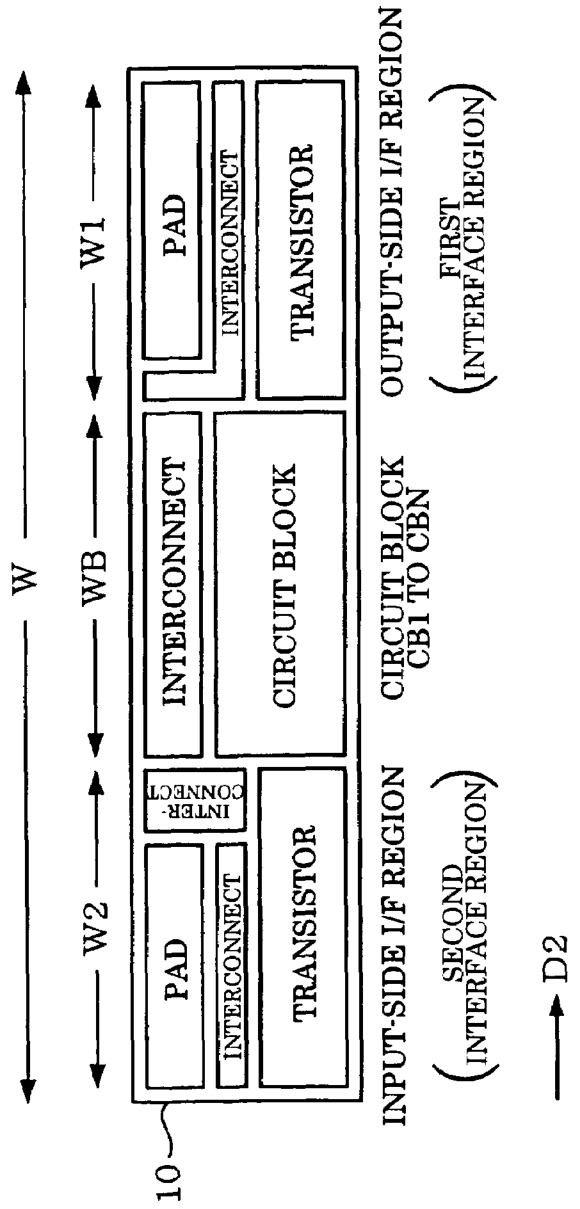
FIGS. 14A and 14B are examples of cross-sectional views of an integrated circuit device.

FIG. 14A illustrates an example of a cross-sectional view of the integrated circuit device 10 along the direction D2. W1, WB, and W2 respectively indicate the widths of the output-side I/F region 12, the circuit blocks CB1 to CBN, and the input-side I/F region 14 in the direction D2. The widths W1, WB, and W2 indicate the widths (maximum widths) of transistor formation regions (bulk regions or active regions) of the output-side I/F region 12, the circuit blocks CB1 to CBN, and the input-side I/F region 14, respectively, and exclude bump formation regions. W indicates the width of the integrated circuit device 10 in the direction D2. In this embodiment, as shown in FIG. 14A, a configuration can be achieved in which another circuit block is not provided between the circuit blocks CB1 to CBN and the output-side and input-side I/F regions 12 and 14 in the direction D2. Therefore, the width W may be set at $W1+WB+W2 \leqq W < W1+2\times WB+W2$. Or, since $W1+W2<WB$ is satisfied, the width W may be set at $W<2\times WB$.

Figure 14B:
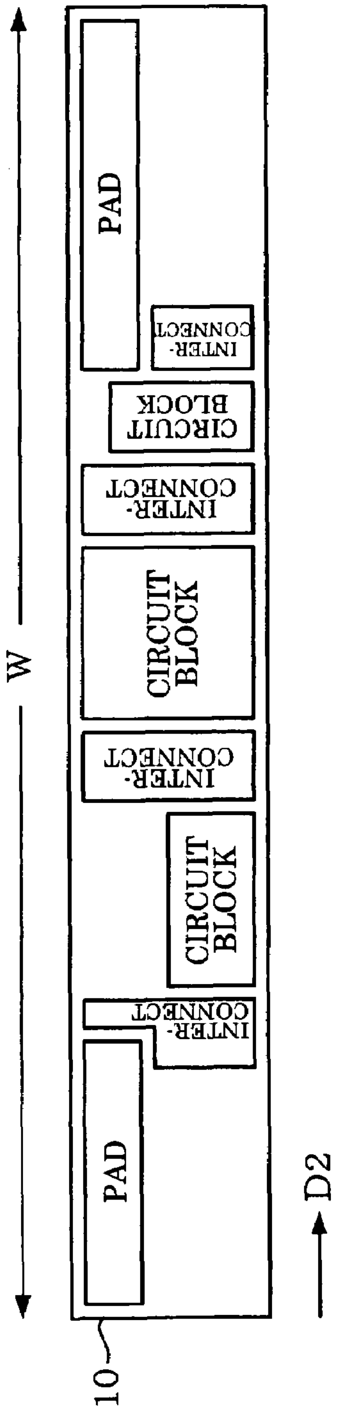

In the arrangement methods shown in FIGS. 9A and 10A, two or more circuit blocks are disposed along the direction D2, as shown in FIG. 14B. Wiring regions are formed between the circuit blocks and between the circuit block and the I/F region in the direction D2. Therefore, since the width W of the integrated circuit device 10 in the direction D2 (short side direction) is increased, it is difficult to realize a narrow chip.

In the arrangement methods shown in FIGS. 11, 13A, and 13B, the circuit blocks CB1 to CBN are disposed along the direction D1. In FIG. 14A, the transistor (circuit element) can be disposed under the pad (bump) (active surface bump). Moreover, the signal lines can be formed between the circuit blocks and between the circuit block and the I/F region using global lines formed in the upper layer (lower layer of the pad) of local lines which are lines in the circuit blocks. Therefore, the width W in the direction D2 can be reduced while maintaining the length of the integrated circuit device 10 in the direction D1, whereby a narrow chip can be realized.

In the arrangement methods shown in FIGS. 11, 13A, and 13B, since the circuit blocks CB1 to CBN are disposed along the direction D1, it is possible to easily deal with a change in the product specification or the like. Specifically, since products of various specifications can be designed using a common platform, the design efficiency can be improved. For example, when the number of pixels or the number of grayscales of the display panel is increased or decreased in FIGS. 13A and 13B, it is possible to deal with such a situation by merely increasing or decreasing the number of memory blocks or data driver blocks, the number of image data read operations in one horizontal scan period, or the like. FIGS. 13A and 13B illustrate examples of an amorphous TFT panel display driver including a memory. When developing a low-temperature polysilicon TFT panel display driver including a memory, it suffices to remove the scan driver block from the circuit blocks CB1 to CBN. When developing a product which does not include a memory, it suffices to remove the memory block. Since effects on other circuit blocks are minimized even if the circuit block is removed corresponding to the specification, the design efficiency can be improved.

In the arrangement methods shown in FIGS. 11, 13A, and 13B, the widths (heights) of the circuit blocks CB1 to CBN in the direction D2 can be adjusted to the width (height) of the data driver block or the memory block, for example. When the number of transistors of each circuit block is increased or decreased, since it is possible to deal with such a situation by increasing or decreasing the length of each circuit block in the direction D1, the design efficiency can be further improved. For example, when the number of transistors of each circuit block is increased or decreased in FIGS. 13A and 13B due to a change in the configuration of the grayscale voltage generation circuit block or the power supply circuit block, it is possible to deal with such a situation by increasing or decreasing the length of the grayscale voltage generation circuit block or the power supply circuit block in the direction D1.

8. Central Arrangement of High-speed I/F Circuit Block in Narrow Integrated Circuit Device As described with reference to FIGS. 6A to 6C, when mounting the integrated circuit device 10 using the COG mounting technology or the like, the contact resistance of the bumps is increased on the ends of the integrated circuit device 10 due to the difference in stress between the ends and the center of the integrated circuit device 10. In particular, the narrower the integrated circuit device 10 as shown in FIGS. 11, 13A, and 13B, the larger the difference in stress between the ends and the center, and the greater the increase in the contact resistance of the bumps on the ends.

In the high-speed I/F circuit, the impedance is matched between the transmitter side and the receiver side in order to prevent signal reflection. However, when the pads connected with the bumps on the ends of the integrated circuit device 10 are used as the pads of the high-speed I/F circuit, an impedance mismatch occurs due to an increase in the contact resistance of the bump indicated by F1.

Figure 15A:
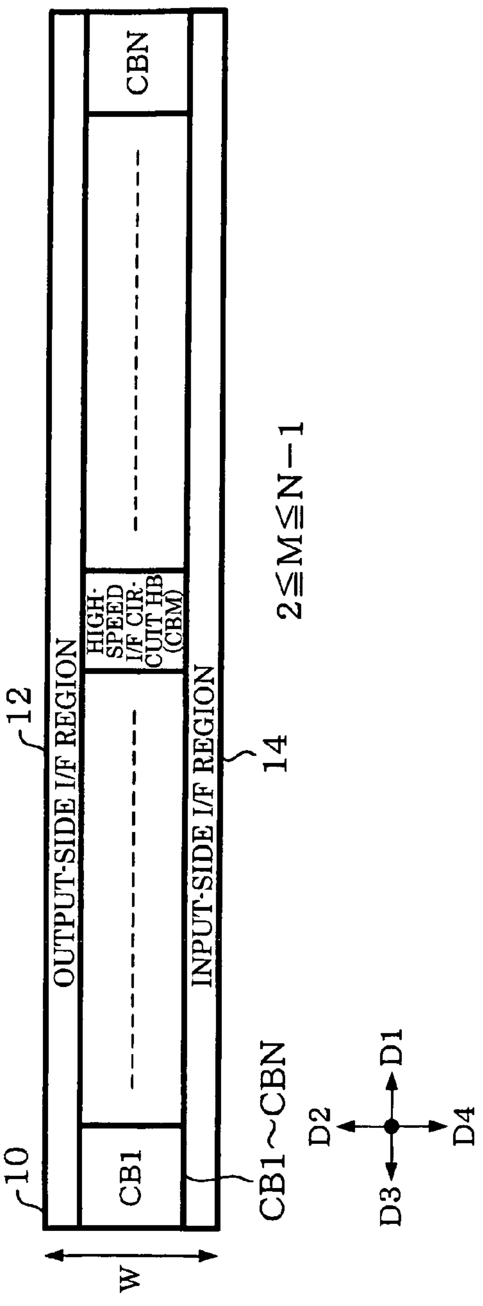
FIGS. 15A and 15B are views illustrative of an arrangement method for a high-speed I/F circuit.

In this embodiment, the high-speed I/F circuit block HB is disposed near the center of the integrated circuit device 10 excluding the ends in order to solve such a problem. In more detail, as shown in FIG. 15A, the first to Nth circuit blocks CB1 to CBN include the high-speed I/F circuit block HB which transfers data through the serial bus using the differential signals, and a circuit block other than the high-speed I/F circuit block HB (circuit block which realizes a function differing from the function of the high-speed I/F circuit block HB). The circuit block other than the high-speed I/F circuit block HB is a data driver block, for example. Or, the circuit block other than the high-speed I/F circuit block HB is a logic circuit block, a power supply circuit block, or a grayscale voltage generation circuit block. Or, the circuit block other than the data driver block DB is a memory block when the integrated circuit device includes a memory, or a scan driver block when the integrated circuit device is used for an amorphous TFT.

In this embodiment, as shown in FIG. 15A, the high-speed I/F circuit block HB is disposed as the Mth circuit block CBM (2≦M≦N−1) of the circuit blocks CB1 to CBN. Specifically, the high-speed I/F circuit block HB is disposed as the circuit block CBM excluding the circuit blocks CB1 and CBN on either end of the integrated circuit device 10. This prevents the high-speed I/F circuit block HB from being disposed on the ends of the integrated circuit device 10. Therefore, an impedance mismatch due to an increase in the contact resistance, as indicated by F1 in FIG. 6C, can be reduced, whereby deterioration of the high-speed serial transfer signal quality can be reduced.

Figure 15B:
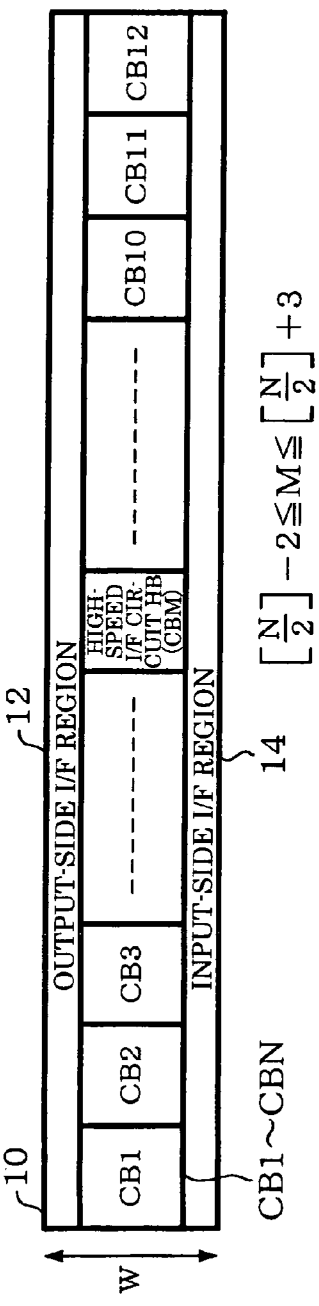

In order to minimize an increase in the contact resistance to improve the signal quality, the value M of the circuit block CBM disposed as the high-speed I/F circuit block HB may be set at [N/2]−2≦M≦[N/2]+3, as shown in FIG. 15B. [X] is the maximum integer which does not exceed X. For example, when the number of circuit blocks is N=12, 4≦M≦9. Therefore, the high-speed I/F circuit block HB is disposed as one of the circuit blocks CB4 to CB9 of the circuit blocks CB1 to CB12. This ensures that the high-speed I/F circuit block HB is disposed near the center of the integrated circuit device 10. Therefore, the contact resistance of the bump or the like has the characteristics indicated by F2 in FIG. 6C, whereby an impedance mismatch due to an increase in the contact resistance can be further reduced. The value M may also be set at [N/2]−1≦M≦[N/2]+2. This ensures that the high-speed I/F circuit block HB is disposed nearer to the center of the integrated circuit device 10, whereby an impedance mismatch can be minimized.

Note that various modifications and variations may be made as to the arrangement of the high-speed I/F circuit block HB. In the layout example shown in FIG. 13B, the high-speed I/F circuit block HB is disposed between the memory block MB2 and the data driver block DB3. Note that the high-speed I/F circuit block HB may be disposed between the memory block MBI and the data driver block DB2 or between the memory block MB3 and the data driver block DB4. In FIG. 13B, image data used by the Jth data driver block DBJ (1≦J<I) is stored in the Jth memory block MBJ, and a number of signal lines are provided between the memory block MBJ and the data driver block DBJ. Therefore, it is preferable to dispose the high-speed I/F circuit block HB between the memory block MBJ and the data driver block DBJ+1 instead of disposing the high-speed I/F circuit block HB between the data driver block DBJ and the memory block MBJ.

In FIG. 13B, the high-speed I/F circuit block HB may be disposed between the scan driver block SB1 and the power supply circuit block PB or between the power supply circuit block PB and the data driver block DB1. Or, the high-speed I/F circuit block HB may be disposed between the grayscale voltage generation circuit block GB and the logic circuit block LB or between the logic circuit block LB and the scan driver block SB2. However, since the data received by the high-speed I/F circuit block HB is input to the logic circuit block LB, it is preferable to dispose the high-speed I/F circuit block HB near the logic circuit block LB. It is still more preferable to dispose the high-speed I/F circuit block HB adjacent to the logic circuit block LB. In FIG. 13B, the logic circuit block LB (and the grayscale voltage generation circuit block GB) may be disposed near the center of the integrated circuit device 10, for example. In more detail, the logic circuit block LB (and the grayscale voltage generation circuit block GB) is disposed between the memory block MB2 (MBJ in a broad sense) and the data driver block DB3 (DBJ+1 in a broad sense), for example. The high-speed I/F circuit block HB may be disposed adjacent to the logic circuit block LB.

Figure 16A:
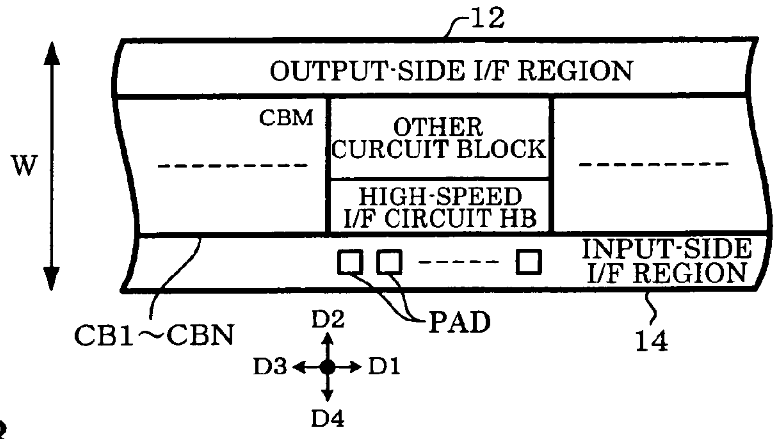
FIGS. 16A to 16D are views illustrative of an arrangement method for a high-speed I/F circuit.

As shown in FIG. 16A, the Mth circuit block CBM may include the high-speed I/F circuit block HB and another circuit block. Specifically, a plurality of circuit blocks are provided in the Mth circuit block CBM so that one of the circuit blocks is the high-speed I/F circuit block HB. In FIG. 16A, the high-speed I/F circuit block HB is disposed on the direction D2 side of the input-side I/F region 14 (second interface region). The other circuit block is adjacently disposed on the direction D2 side of the high-speed I/F circuit block HB.

The pads (e.g. pads for DATA+/−, STB+/−, CLK+/−, and power supply) connected with the high-speed I/F circuit block HB may be disposed in the input-side I/F region 14 in the area on the direction D4 side of the high-speed I/F circuit block HB. A protective element (electrostatic protection transistor) and the like may be disposed in the area under the pads or between the pads.

Figure 16B:
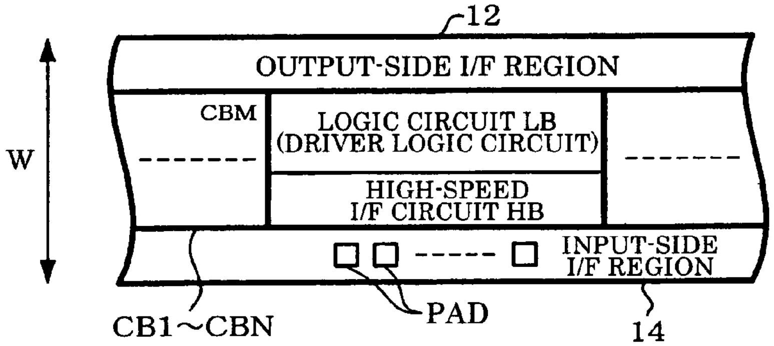

The other circuit block provided in the circuit block CBM may be the logic circuit block LB (driver logic circuit block), as shown in FIG. 16B. The logic circuit block LB generates the display control signal (signal which controls the display timing or display processing) and sets grayscale data. Specifically, the data received by the high-speed I/F circuit block HB is transferred to the memory block MB or the data driver block DB through the logic circuit block LB. The clock signal (including the strobe signal) received by the high-speed I/F circuit block HB is input to the logic circuit block LB, and the display control signal or the like is generated based on the clock signal. Therefore, it is preferable to dispose the high-speed I/F circuit block HB near the logic circuit block LB. Specifically, it is preferable that the high-speed I/F circuit block HB and the logic circuit block LB be provided in the circuit block CBM and the high-speed I/F circuit block HB and the logic circuit block LB be disposed (adjacently disposed) along the direction D2, as shown in FIG. 16B.

According to the arrangement method shown in FIG. 16B, since the high-speed I/F logic circuit HL is disposed between the physical layer circuit PHY and the driver logic circuit block LB so that the physical layer circuit PHY and the driver logic circuit block LB are not adjacently disposed, adverse effects of noise can be prevented.

Figure 16C:
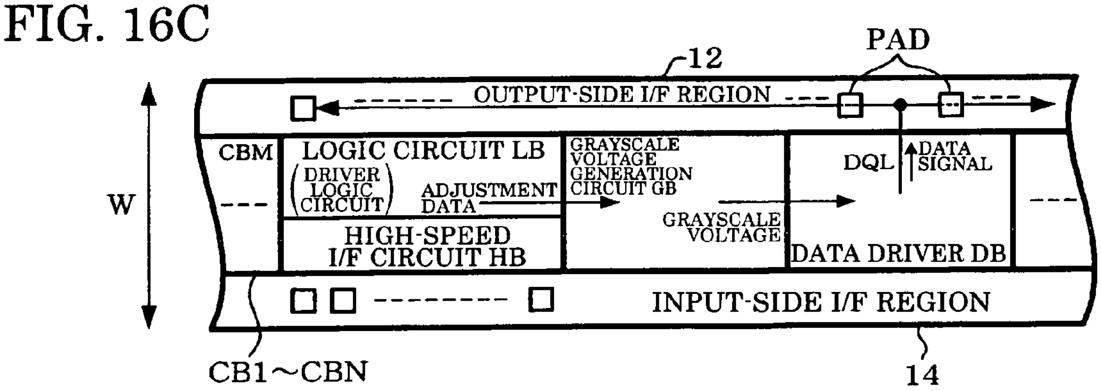
Figure 16D:
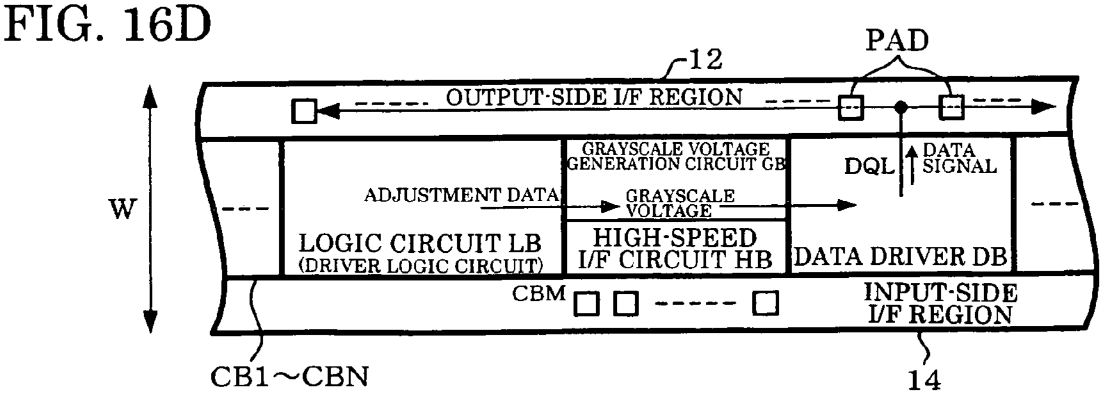

When providing the logic circuit block LB and the high-speed I/F circuit block HB in the circuit block CBM, the circuit block CBM including the logic circuit block LB and the high-speed I/F circuit block HB may be disposed adjacent to the grayscale voltage generation circuit block GB which generates the grayscale voltage along the direction D1, as shown in FIG. 16C. Specifically, it is preferable to adjacently dispose the high-speed I/F circuit block HB and the logic circuit block LB, as described above. It is also preferable to adjacently dispose the grayscale voltage generation circuit block GB and the logic circuit block LB, as described above. Therefore, the high-speed I/F circuit block HB and the grayscale voltage generation circuit block GB can be disposed adjacent to the logic circuit block LB by adjacently disposing the circuit block CBM and the grayscale voltage generation circuit block GB, as shown in FIG. 16C, whereby the layout efficiency can be improved. The grayscale voltage generation circuit block GB and the high-speed I/F circuit block HB may include analog circuits such as an impedance conversion circuit (operational amplifier). Therefore, the arrangement as shown in FIG. 16D allows an interconnect for supplying power to the analog circuits or the like to be used in common, whereby the layout efficiency can be further improved. In FIG. 16C, the circuit blocks CB1 to CBN include the data driver block DB. The grayscale voltage generation circuit block GB is disposed between the circuit block CBM, which includes the logic circuit block LB and the high-speed I/F circuit block HB, and the data driver block DB.

As shown in FIG. 16D, the other circuit block provided in the circuit block CBM together with the high-speed I/F circuit block HB may be the grayscale voltage generation circuit block GB. Specifically, it is preferable to adjacently dispose the high-speed I/F circuit block HB and the logic circuit block LB, as described above. It is also preferable to adjacently dispose the grayscale voltage generation circuit block GB and the logic circuit block LB, as described above. Therefore, when the grayscale voltage generation circuit block GB and the high-speed I/F circuit block HB are provided in the circuit block CBM, as shown in FIG. 16D, the grayscale voltage generation circuit block GB and the high-speed I/F circuit block HB can be disposed adjacent to the logic circuit block LB, whereby the layout efficiency can be improved. The grayscale voltage generation circuit block GB and the high-speed I/F circuit block HB may include analog circuits such as an impedance conversion circuit (operational amplifier), as described above. Therefore, the arrangement as shown in FIG. 16D allows an interconnect for supplying power to the analog circuits or the like to be used in common, whereby the layout efficiency can be further improved.

Figure 17:
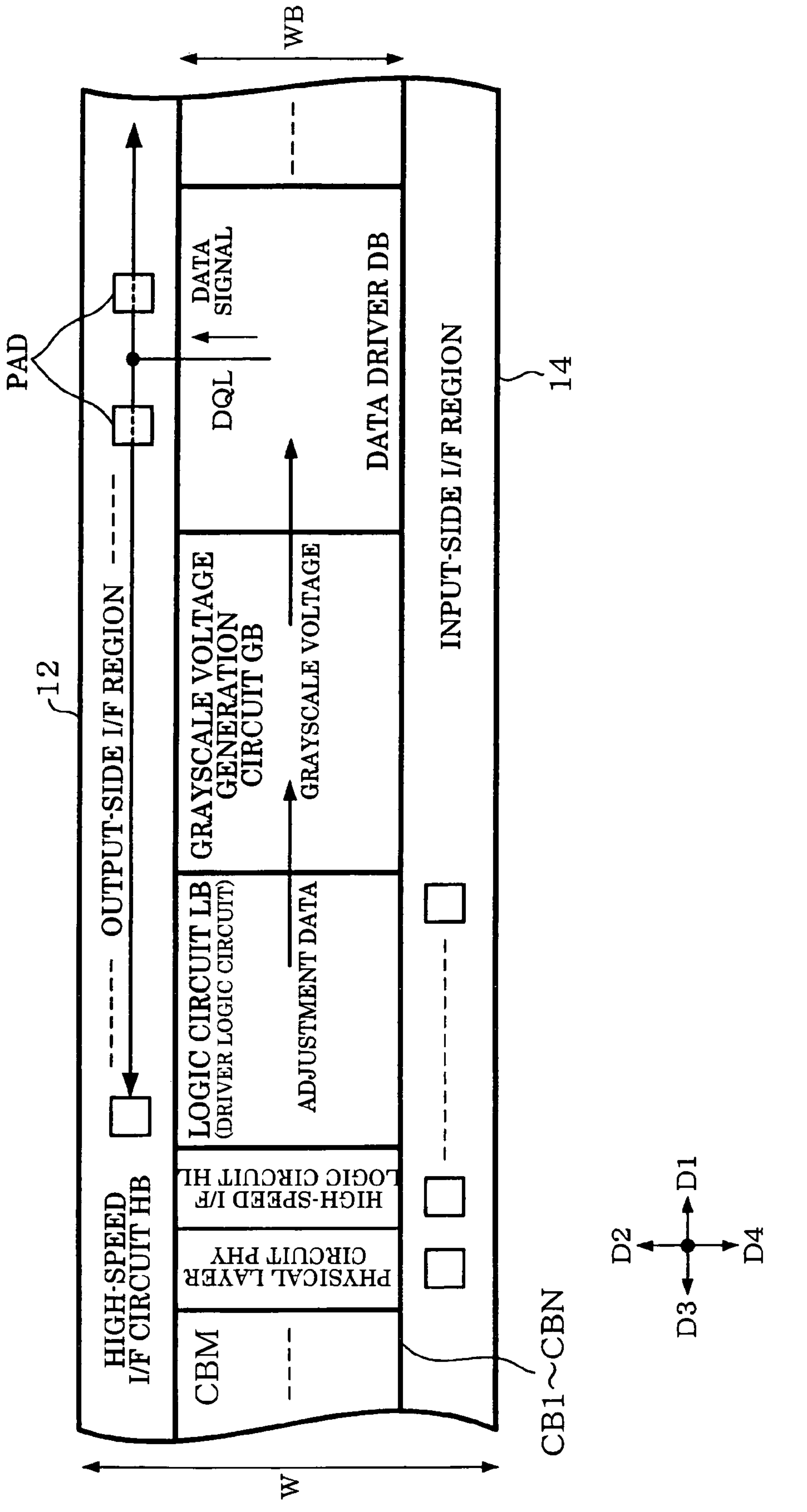
FIG. 17 illustrates of an arrangement method for a high-speed I/F circuit.

As shown in FIG. 17, the high-speed I/F circuit block HB and the logic circuit block LB (driver logic circuit block) may be disposed (adjacently disposed) along the direction D1. In more detail, the physical layer circuit PHY and the high-speed I/F logic circuit HL included in the high-speed I/F circuit block HB are also disposed (adjacently disposed) along the direction D1.

Specifically, the arrangement method according to this embodiment reduced the width W of the integrated circuit device in the direction D2 and reduces the width WB of the circuit blocks CB1 to CBN in the direction D2. In the arrangement method shown in FIG. 16B, since the high-speed I/F circuit block HB and the logic circuit block LB are disposed along the direction D2, the height of the high-speed I/F circuit block HB in the direction D2 cannot be sufficiently secured, whereby the layout work of the high-speed I/F circuit block HB may become difficult.

According to the arrangement method shown in FIG. 17, the high-speed I/F circuit block HB and the logic circuit block LB are disposed along the direction D1. Therefore, the height of the high-speed I/F circuit block HB can be sufficiently secured so that the height of the high-speed I/F circuit block HB is approximately equal to the width WB of the circuit blocks CB1 to CBN in the direction D2. As a result, the layout work of the high-speed I/F circuit block HB can be facilitated.

According to the arrangement method shown in FIG. 17, the high-speed I/F logic circuit HL is disposed between the physical layer circuit PHY and the driver logic circuit block LB so that the physical layer circuit PHY and the driver logic circuit block LB are not adjacently disposed. Therefore, the physical layer circuit PHY is prevented from being adversely affected by nose generated by the driver logic circuit block LB or the driver logic circuit block LB is prevented from being adversely affected by nose generated by the physical layer circuit PHY, whereby the transmission quality can be maintained, and malfunction can be prevented.

In the arrangement methods shown in FIGS. 16B to 17, the high-speed I/F circuit block HB may include the physical layer circuit of the high-speed I/F circuit, and the logic circuit block LB may include a higher-level circuit of the physical layer circuit. For example, the high-speed I/F circuit block HB may include the physical layer circuit 130 of the high-speed I/F circuit 120 shown in FIG. 3A, and the logic circuit block LB may include the low-speed logic circuit 170. This allows the low-speed logic circuit 170 to be implemented by an automatic placement-routing method such as a gate array, whereby the design efficiency can be increased. Note that part or the entirety of the high-speed logic circuit 160 may be included in the logic circuit block LB.

In FIGS. 16C to 17, the circuit blocks CB1 to CBN include the data driver block DB which receives the grayscale voltage from the grayscale voltage generation circuit block GB and drives the data lines. In FIGS. 16C to 17, the grayscale voltage generation circuit block GB is disposed between the data driver block DB and the logic circuit block LB. The grayscale voltage generation circuit block GB and the data driver block DB may or may not be adjacently disposed.

In FIGS. 16C to 17, the adjustment data signal lines are provided between the grayscale voltage generation circuit block GB and the logic circuit block LB, and the number of adjustment data signal lines is very large. The grayscale voltage generation circuit block GB must output the grayscale voltage to the data driver block DB, and the number of grayscale voltage output lines is very large. Therefore, when the grayscale voltage generation circuit block GB is not disposed between the data driver block DB and the logic circuit block LB, but is disposed on the direction D1 side of the logic circuit block LB, not only the adjustment data signal lines but also the grayscale voltage output lines must be provided between the grayscale voltage generation circuit block GB and the logic circuit block LB. This makes it difficult to provide other signal lines and power supply lines between the grayscale voltage generation circuit block GB and the logic circuit block LB using the global line or the like, whereby the wiring efficiency is decreased.

On the other hand, since the grayscale voltage generation circuit block GB is disposed between the data driver block DB and the logic circuit block LB in FIGS. 16C to 17, the grayscale voltage output lines need not be provided between the grayscale voltage generation circuit block GB and the logic circuit block LB. Therefore, other signal lines and power supply lines can be provided between the grayscale voltage generation circuit block GB and the logic circuit block LB using the global line or the like, whereby the wiring efficiency can be improved.

In FIGS. 16C to 17, the data signal output line DQL from the data driver block DB is provided in the data driver block DB along the direction D2. On the other hand, the data signal output line DQL is provided in the output-side I/F region 12 (first interface region) along the direction D1 (D3). In more detail, the data signal output line DQL is provided in the output-side I/F region 12 along the direction D1 using the global line located in the lower layer of the pad and in the upper layer of the local line (transistor line) inside the output-side I/F region 12. This allows the data signal from the data driver block DB to be appropriately output to the display panel through the pad by efficiently providing the signal lines for the adjustment data, the grayscale voltage, and the data signal, as shown in FIGS. 16C to 17. Moreover, the data signal output line DQL can be connected with the pad or the like by utilizing the output-side I/F region 12, whereby an increase in the width W of the integrated circuit device in the direction D2 can be prevented.

9. Shape Ratio and Width of Integrated Circuit Device

Figure 18A:
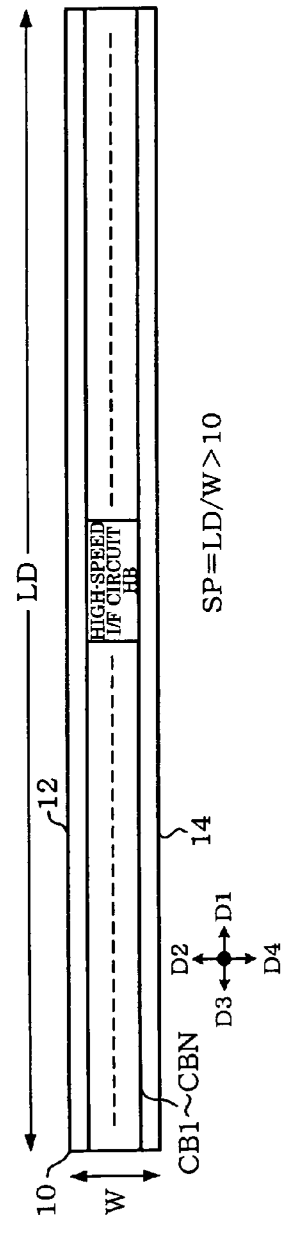
FIGS. 18A, 18B, and 18C are views illustrative of the shape ratio and width of an integrated circuit device.

In this embodiment, when the width of the integrated circuit device 10 in the direction D2 is W and the length of the integrated circuit device 10 in the direction D1 is LD, the length/width shape ratio SP=LD/W of the integrated circuit device 10 is set at SP>10, as shown in FIG. 18A.

In such a narrow chip with a shape ratio of SP>10, an impedance mismatch occurs due to the contact resistance of the bump, as described with reference to FIGS. 6A, 6B, and 6C. Specifically, the impedance mismatch problem, which does not become obvious in a square chip, is serious in the narrow chip with a shape ratio of SP>10. In this embodiment, this problem is solved by using the methods shown in FIGS. 15A to 17 so that the high-speed serial transfer signal quality is successfully maintained while achieving facilitation of mounting and a reduction in cost.

The size of a display panel incorporated in a portable telephone or the like is generally constant. Therefore, the width W of the integrated circuit device 10 in the direction D2 must be reduced in order to realize a narrow chip with a shape ratio of SP>10, as shown in FIG. 18A.

Figure 18B:
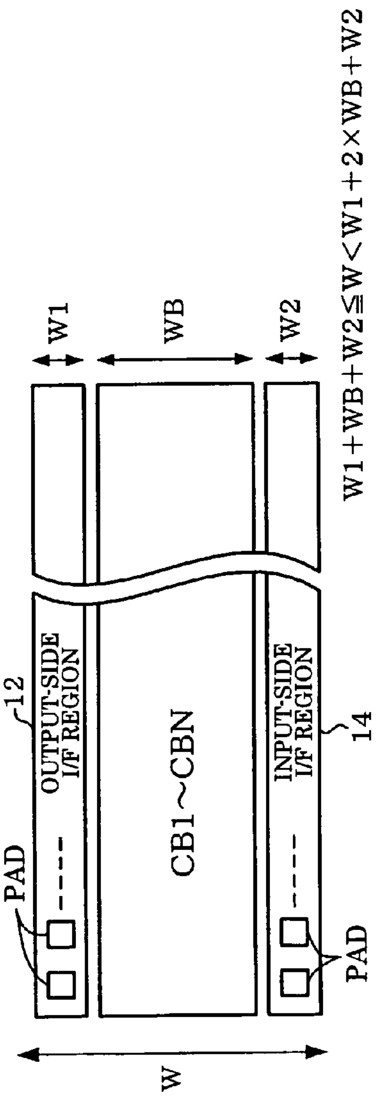

In this embodiment, the relationship W1+WB+W2≦W<W1+2×WB+W2 is satisfied, as shown in FIG. 18B. W1, WB, and W2 respectively indicate the widths of the output-side I/F region 12, the first to Nth circuit blocks CB1 to CBN, and the input-side I/F region 14 in the direction D2.

In the arrangement methods shown in FIGS. 9A and 10A, two or more circuit blocks are disposed along the direction D2. Therefore, the width W in the direction D2 is equal to or greater than W1+2×WB+W2. As a result, the width W of the integrated circuit device in the direction D2 (short side direction) is increased, whereby a narrow chip cannot be realized.

In this embodiment, since another circuit block is not provided between the data driver block DB and the I/F regions 12 and 14, W<W1+2×WB+W2 is satisfied. Therefore, the width W of the integrated circuit device in the direction D2 can be reduced. In more detail, the width W in the direction D2 (short side direction) may be set at W<2 mm. More specifically, the width W in the direction D2 may be set at W<1.5 mm. It is preferable that W>0.9 mm be satisfied taking inspection and mounting of the chip into consideration. The length LD in the long side direction may be set at 15 mm<LD<27 mm. The chip shape ratio SP=LD/W may be set at SP>10, as described above, and still more preferably set at SP>12. This realizes a narrow integrated circuit device in which W=1.3 mm, LD=22 mm, and SP=16.9 or W=1.35 mm, LD=17 mm, and SP=12.6 corresponding to the specification such as the number of pins, for example.

The widths W1, WB, and W2 shown in FIG. 18B indicate the widths of transistor formation regions (bulk regions or active regions) of the output-side I/F region 12, the circuit blocks CB1 to CBN, and the input-side I/F region 14, respectively. Specifically, output transistors, input transistors, input-output transistors, transistors of electrostatic protection elements, and the like are formed in the I/F regions 12 and 14. The transistors of the circuits are formed in the circuit blocks CB1 to CBN. The widths W1, WB, and W2 are determined based on the well regions and the diffusion regions in which such transistors are formed. For example, in order to realize a narrower integrated circuit device, it is preferable to form bumps (active surface bumps) on the transistors of the circuit blocks CB1 to CBN. In more detail, a resin core bump, in which the core is formed of a resin and a metal layer is formed over the surface of the resin, or the like is formed on the transistor (active region). The bumps (external connection terminals) are connected with the pads disposed in the I/F regions 12 and 14 through metal interconnects. The widths W1, WB, and W2 according to this embodiment are not the widths of the bump formation regions, but the widths of the transistor formation regions formed under the bumps.

The widths of the circuit blocks CB1 to CBN in the direction D2 may be identical, for example. In this case, it suffices that the width of each circuit block be substantially identical, and the width of each circuit block may differ in the range of several to 20 micrometers (several tens of micrometers), for example. When a circuit block with a different width exists in the circuit blocks CB1 to CBN, the width WB may be the maximum width of the circuit blocks CB1 to CBN. In this case, the maximum width may be the width of the data driver block in the direction D2, for example. When the integrated circuit device includes a memory, the maximum width may be the width of the memory block in the direction D2. A space region with a width of about 20 to 30 micrometers may be provided between the circuit blocks CB1 to CBN and the I/F regions 12 and 14, for example.

Figure 18C:
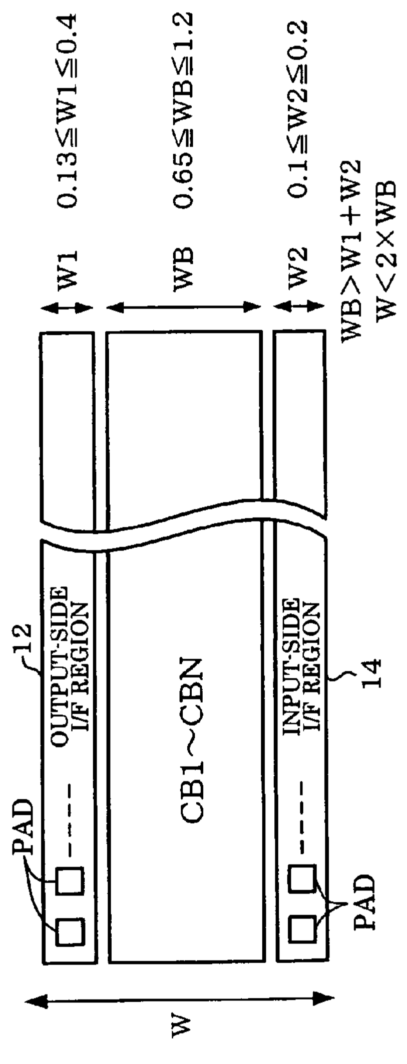

The relationship among the widths W1, WB, and W2 is described below. In this embodiment, the width W1 of the output-side I/F region 12 in the direction D2 may be set at 0.13 mm≦W1≦0.4 mm, as shown in FIG. 18C. The width WB of the circuit blocks CBI to CBN may be set at 0.65 mm≦WB≦1.2 mm. The width W2 of the input-side I/F region 14 may be set at 0.1 mm≦W2≦0.2 mm.

In the output-side I/F region 12, a pad is disposed of which the number of stages in the direction D2 is one or more, for example. The width W1 of the output-side I/F region 12 is minimized by disposing output transistors, transistors for electrostatic protection elements, and the like under the pads, as shown in FIG. 14A. Therefore, the width Wl is 0.13 mm≦W1≦0.4 mm taking the pad width (e.g. 0.1 mm) and the pad pitch into consideration.

In the input-side I/F region 14, a pad is disposed of which the number of stages in the direction D2 is one. The width W2 of the input-side I/F region 14 is minimized by disposing input transistors, transistors for electrostatic protection elements, and the like under the pads, as shown in FIG. 14A. Therefore, the width W2 is 0.1 mm≦W2≦0.2 mm taking the pad width and the pad pitch into consideration. The number of stages of the pad in the direction D2 is set at one or more in the output-side I/F region 12 because the number (or size) of transistors which must be disposed under the pads is greater in the output-side I/F region 12 than in the input-side I/F region 14.

The width WB of the circuit blocks CB1 to CBN is determined based on the width of the data driver block DB or the memory block MB in the direction D2. In order to realize a narrow integrated circuit device, the wiring for a logic signal from the logic circuit block, grayscale voltage signal from the grayscale voltage generation circuit block, and power supply must be formed on the circuit blocks CB1 to CBN using the global lines. The total wiring width is about 0.8 to 0.9 mm, for example. Therefore, the width WB of the circuit blocks CB1 to CBN is 0.65 mm≦WB≦1.2 mm taking the total wiring width into consideration.

Since 0.65 mm≦WB≦1.2 mm is satisfied even if W1=0.4 mm and W2=0.2 mm, WB>W1+W2 is satisfied. When the widths W1, WB, and W2 are minimum values, W1=0.13 mm, WB=0.65 mm, and W2=0.1 mm so that the width W of the integrated circuit device is about 0.88 mm. Therefore, W=0.88 mm<2×WB=1.3 mm is satisfied. When the widths W1, WB, and W2 are maximum values, W1=0.4 mm, WB=1.2 mm, and W2=0.2 mm so that the width W of the integrated circuit device is about 1.8 mm. Therefore, W=1.8 mm<2×WB=2.4 mm is satisfied. Specifically, W<2×WB is satisfied, whereby a narrow integrated circuit device can be realized.

10. Electronic Instrument

Figure 19A:
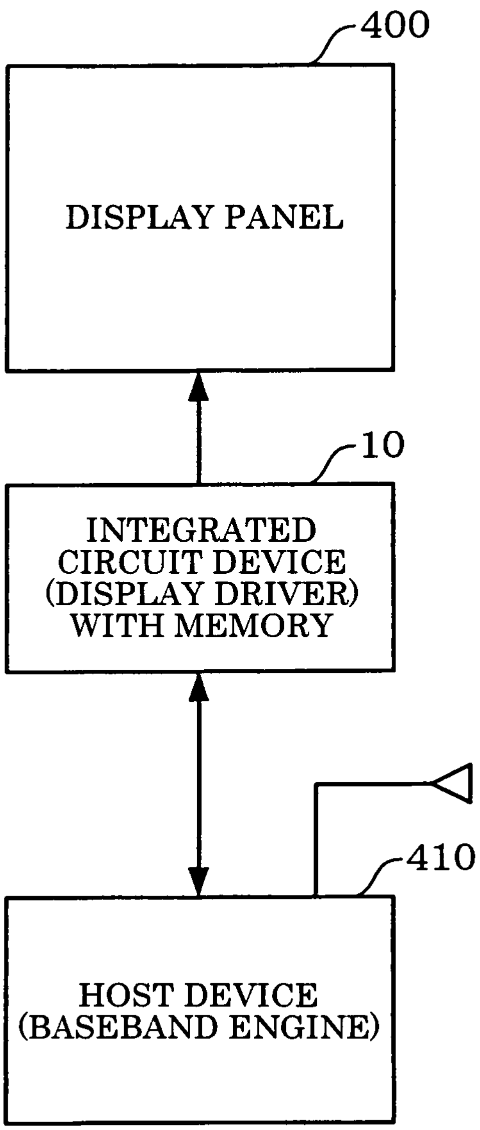
FIGS. 19A and 19B illustrate configuration examples of an electronic instrument.
Figure 19B:
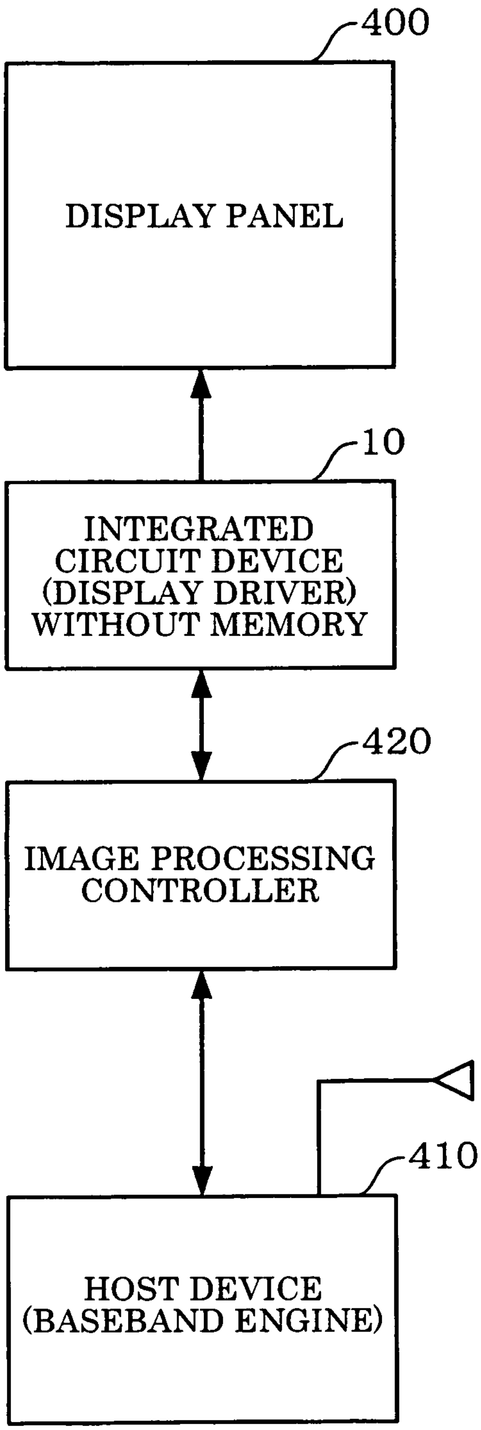

FIGS. 19A and 19B illustrate examples of an electronic instrument (electro-optical device) including the integrated circuit device 10 according to the above embodiment. The electronic instrument may include elements (e.g. camera, operation section, or power supply) other than the elements shown in FIGS. 19A and 19B. The electronic instrument according to this embodiment is not limited to a portable telephone, but may be a digital camera, PDA, electronic notebook, electronic dictionary, projector, rear-projection television, portable information terminal, or the like.

In FIGS. 19A and 19B, a host device 410 is an MPU, a baseband engine, or the like. The host device 410 controls the integrated circuit device 10 which is a display driver. The host device 410 may perform processing as an application engine and a baseband engine or processing as a graphic engine such as compression, decompression, and sizing. An image processing controller 420 shown in FIG. 19B performs processing as a graphic engine such as compression, decompression, or sizing instead of the host device 410.

A display panel 400 includes a plurality of data lines (source lines), a plurality of scan lines (gate lines), and a plurality of pixels specified by the data lines and the scan lines. A display operation is realized by changing the optical properties of an electro-optical element (liquid crystal element in a narrow sense) in each pixel region. The display panel 400 may be formed by an active matrix type panel using switching elements such as a TFT or TFD. The display panel 400 may be a panel other than an active matrix type panel, or may be a panel other than a liquid crystal panel.

In FIG. 19A, an integrated circuit device including a memory may be used as the integrated circuit device 10. In this case, the integrated circuit device 10 writes image data from the host device 410 into the built-in memory, and reads the written image data from the built-in memory to drive the display panel. In FIG. 19B, an integrated circuit device which does not include a memory may be used as the integrated circuit device 10. In this case, image data from the host device 410 is written into a memory provided in the image processing controller 420. The integrated circuit device 10 drives the display panel 400 under control of the image processing controller 420.

Although only some embodiments of the invention have been described in detail above, those skilled in the art would readily appreciate that many modifications are possible in the embodiments without materially departing from the novel teachings and advantages of the invention. Accordingly, such modifications are intended to be included within the scope of the invention. Any term (e.g. high-speed logic circuit, low-speed logic circuit, first capacitor region, and second capacitor region) cited with a different term (e.g. first logic circuit, second logic circuit, first region, and second region) having a broader meaning or the same meaning at least once in the specification and the drawings can be replaced by the different term in any place in the specification and the drawings. The configuration, arrangement, and operation of the integrated circuit device and the electronic instrument are not limited to those described in the above embodiments. Various modifications and variations may be made.

What is claimed is:

1. An integrated circuit device comprising:

a high-speed interface circuit block that transfers data through a serial bus; and a driver logic circuit block that generates a display control signal;

wherein the high-speed interface circuit block including:

a physical layer circuit including a receiver circuit that receives serial data through the serial bus; and a high-speed interface logic circuit including a serial/parallel conversion circuit that converts serial data received through the serial bus into parallel data; wherein the high-speed interface circuit block being disposed so that the high-speed interface logic circuit is disposed between the physical layer circuit and the driver logic circuit block and the physical layer circuit and the driver logic circuit block are not adjacently disposed.

2. The integrated circuit device as defined in claim 1, further comprising:

when a direction from a first side that is a short side of the integrated circuit device toward a third side opposite to the first side is a first direction and a direction from a second side that is a long side of the integrated circuit device toward a fourth side opposite to the second side is a second direction, the high-speed interface logic circuit is disposed on the second direction side of the physical layer circuit, and the driver logic circuit block is disposed on the second direction side of the high-speed interface logic circuit.

3. The integrated circuit device as defined in claim 1, further comprising:

when a direction from a first side that is a short side of the integrated circuit device toward a third side opposite to the first side is a first direction and a direction from a second side that is a long side of the integrated circuit device toward a fourth side opposite to the second side is a second direction, the high-speed interface logic circuit is disposed on the second direction side of the physical layer circuit, and the driver logic circuit block is disposed on the first direction side of the high-speed interface logic circuit.

4. The integrated circuit device as defined in claim 1, further comprising:

a circuit block other than the high-speed interface circuit block is disposed between the first side of the integrated circuit device and the high-speed interface circuit block, and a circuit block other than the high-speed interface circuit block is disposed between the third side of the integrated circuit device opposite to the first side and the high-speed interface circuit block.

5. The integrated circuit device as defined in claim 1, wherein the high-speed interface circuit block is formed as a macroblock including a pad region; and wherein the high-speed interface circuit block is disposed so that the second side of the integrated circuit device coincides with a second side of the high-speed interface circuit block.

6. The integrated circuit device as defined in claim 1, further comprising:

a power supply line for supplying power to a circuit block other than the high-speed interface circuit block is provided along three sides of a rectangular region of the high-speed interface circuit block so that the power supply line avoids the rectangular region.

7. The integrated circuit device as defined in claim 1, further comprising:

a grayscale voltage generation circuit block which generates grayscale voltages;

wherein the driver logic circuit block and the grayscale voltage generation circuit block are adjacently disposed.

8. The integrated circuit device as defined in claim 7, further comprising:

at least one data driver block that drives data lines;

wherein the grayscale voltage generation circuit block and the data driver block are adjacently disposed.

9. The integrated circuit device as defined in claim 1, wherein the physical layer circuit is disposed so that a first region is formed between a first side of the high-speed interface circuit block and the physical layer circuit and a second region is formed between a third side of the high-speed interface circuit block opposite to the first side and the physical layer circuit.

10. The integrated circuit device as defined in claim 9, wherein the first and second regions are first and second capacitor regions.

11. The integrated circuit device as defined in claim 1, further comprising:

first to Nth circuit blocks (N is an integer of two or more) disposed along a first direction when a direction from a first side that is a short side of the integrated circuit device toward a third side opposite to the first side is a first direction and a direction from a second side that is a long side of the integrated circuit device toward a fourth side opposite to the second side is a second direction;

wherein the first to Nth circuit blocks include the high-speed interface circuit block and a circuit block other than the high-speed interface circuit block; and wherein the high-speed interface circuit block is disposed as an Mth ($2 \leqq M \leqq N-1$) circuit block of the first to Nth circuit blocks.

12. The integrated circuit device as defined in claim 11, wherein the value M is $[N/2]-2 \leqq M \leqq [N/2]+3$ ([X] is maximum integer that does not exceed X).

13. The integrated circuit device as defined in claim 11, wherein the Mth circuit block includes the high-speed interface circuit block and the driver logic circuit block; and wherein the high-speed interface circuit block and the driver logic circuit block are disposed along the second direction.

14. The integrated circuit device as defined in claim 11, wherein the high-speed interface circuit block and the driver logic circuit block are disposed along the first direction.

15. The integrated circuit device as defined in claim 11, wherein the first to Nth circuit blocks include:

a grayscale voltage generation circuit block that generates grayscale voltages; and at least one data driver block that receives the grayscale voltages from the grayscale voltage generation circuit block and drives data lines; and wherein the grayscale voltage select circuit is disposed between the driver logic circuit block and the data driver block.

16. An electronic instrument comprising:

the integrated circuit device as defined in claim 1; and a display panel driven by the integrated circuit device.

17. An electronic instrument comprising:

the integrated circuit device as defined in claim 11; and a display panel driven by the integrated circuit device.

18. An integrated circuit device comprising:

a high-speed interface circuit block that transfers data through a serial bus; and a driver logic circuit block that generates a display control signal, wherein the high-speed interface circuit block including:

a physical layer circuit including a receiver circuit that receives serial data through the serial bus;

a high-speed interface logic circuit including a serial/parallel conversion circuit that converts serial data received through the serial bus into parallel data, and the high-speed interface circuit block being disposed so that the high-speed interface logic circuit is disposed between the physical layer circuit and the driver logic circuit block.

19. An electronic instrument comprising:

the integrated circuit device as defined in claim 18; and a display panel driven by the integrated circuit device.

20. An integrated circuit device comprising:

an interface circuit block that transfers data through a serial bus; and a driver logic circuit block that generates a display control signal, wherein the interface circuit block including:

a physical layer circuit including a receiver circuit that receives serial data through the serial bus;

an interface logic circuit including a serial/parallel conversion circuit that converts serial data received through the serial bus into parallel data, and the interface circuit block being disposed so that the interface logic circuit is disposed between the physical layer circuit and the driver logic circuit block.

* * * * *